(12) United States Patent
Engelhardt et al.

(10) Patent No.: US 8,906,782 B2
(45) Date of Patent: Dec. 9, 2014

(54) METHOD OF SEPARATING SEMICONDUCTOR DIE USING MATERIAL MODIFICATION

(75) Inventors: Manfred Engelhardt, Villach-Landskron (AT); Petra Fischer, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/359,548

(22) Filed: Jan. 27, 2012

(65) Prior Publication Data

US 2013/0115755 A1    May 9, 2013

Related U.S. Application Data

(63) Continuation-in-part of application No. 13/290,197, filed on Nov. 7, 2011.

(51) Int. Cl.

| | | |
|---|---|---|
| H01L 21/00 | (2006.01) | |
| H01L 21/304 | (2006.01) | |
| H01L 21/306 | (2006.01) | |
| H01L 21/3065 | (2006.01) | |
| H01L 21/683 | (2006.01) | |
| H01L 21/78 | (2006.01) | |
| H01L 29/16 | (2006.01) | |

(52) U.S. Cl.
CPC .......... *H01L 21/306* (2013.01); *H01L 21/3043* (2013.01); *H01L 21/30604* (2013.01); *H01L 21/3065* (2013.01); *H01L 2221/68327* (2013.01); *H01L 21/6836* (2013.01); *H01L 29/1608* (2013.01); *H01L 21/6835* (2013.01); *H01L 21/78* (2013.01)
USPC .......................... 438/462; 438/460; 438/464

(58) Field of Classification Search
USPC ........................................................ 438/460
See application file for complete search history.

(56) References Cited

U.S. PATENT DOCUMENTS

| | | | | |
|---|---|---|---|---|
| 6,576,998 | B1 * | 6/2003 | Hoffman ...................... | 257/724 |
| 2002/0187589 | A1 * | 12/2002 | Tsujimoto ..................... | 438/118 |
| 2006/0033054 | A1 * | 2/2006 | Yamada .................... | 250/504 R |
| 2007/0099397 | A1 * | 5/2007 | Kirby et al. .................. | 438/460 |
| 2008/0064214 | A1 | 3/2008 | Han et al. | |
| 2010/0300612 | A1 * | 12/2010 | Yamamoto et al. ........... | 156/249 |
| 2010/0319503 | A1 * | 12/2010 | Bakker et al. .................... | 83/13 |
| 2011/0097849 | A1 * | 4/2011 | Maki et al. .................... | 438/107 |
| 2011/0281377 | A1 * | 11/2011 | Yamada et al. ................. | 438/10 |
| 2012/0032298 | A1 * | 2/2012 | Miyagawa et al. ........... | 257/531 |

OTHER PUBLICATIONS

Wei-Hsu Chang et al. ; "Electrochemical Etching of n-Type 6H-SiC Without UV Illumination"; Journal of Microelectromechanical Systems, vol. 15, No. 3, Jun. 2006; pp. 548-552.

Joseph S. Shor et al. ; "Photoelectrochemical Etching of 6H-SiC"; J. Electrochem. Soc., vol. 141, No. 3, Mar. 1994; The Electrochemical Society, Inc. pp. 778-781.

\* cited by examiner

*Primary Examiner* — Charles Garber
*Assistant Examiner* — Brigitte Paterson

(57) ABSTRACT

A method for separating semiconductor die includes forming a porous region on a semiconductor wafer and separating the die at the porous region using mechanical or other means.

15 Claims, 18 Drawing Sheets

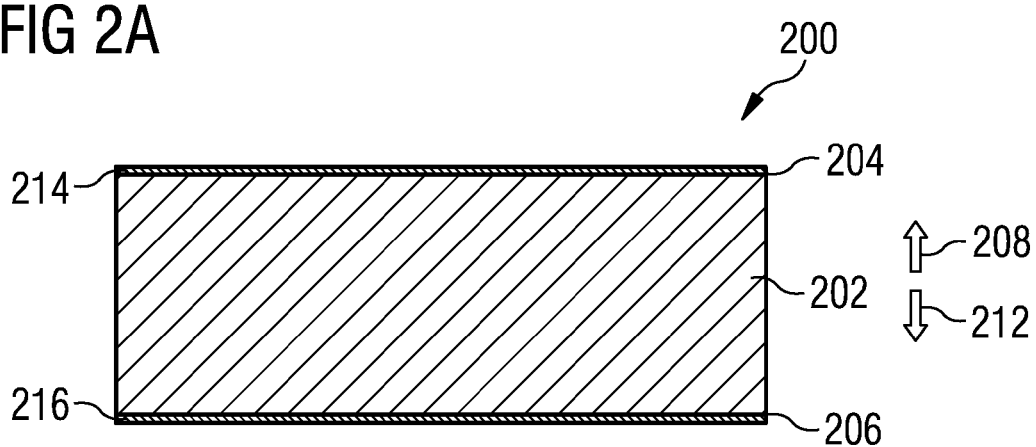
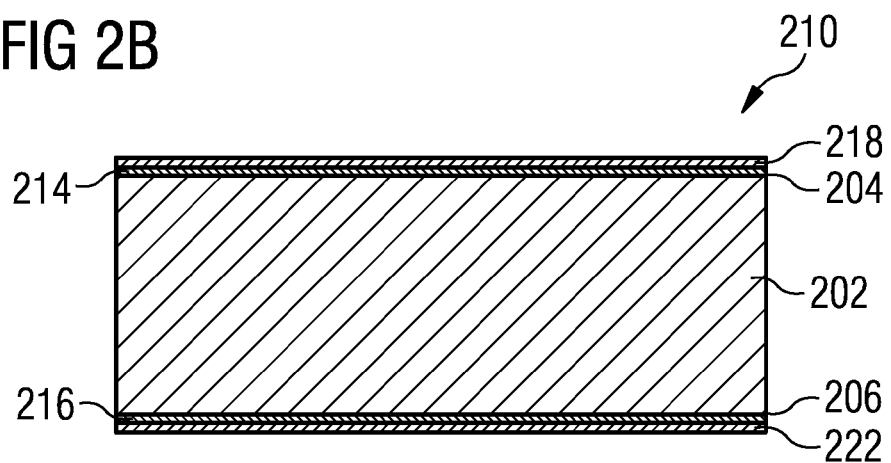
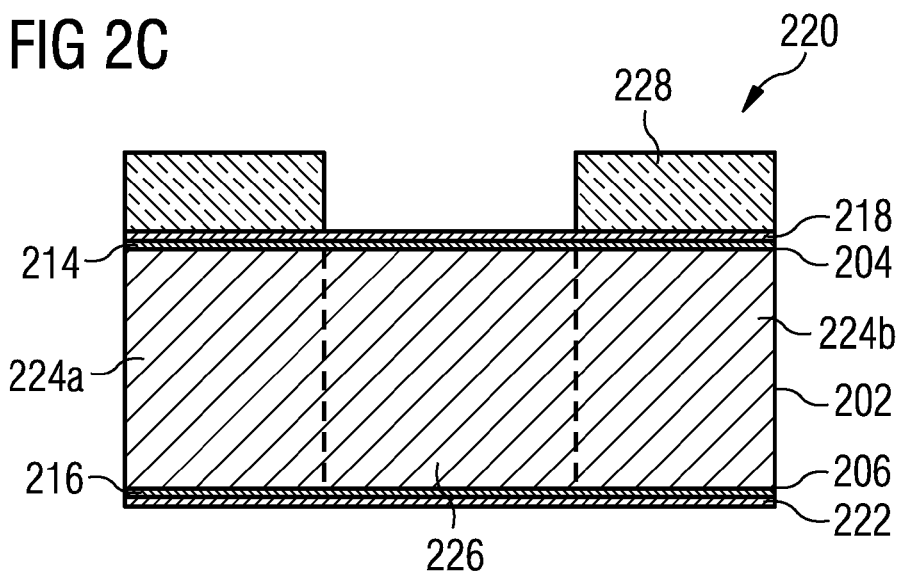

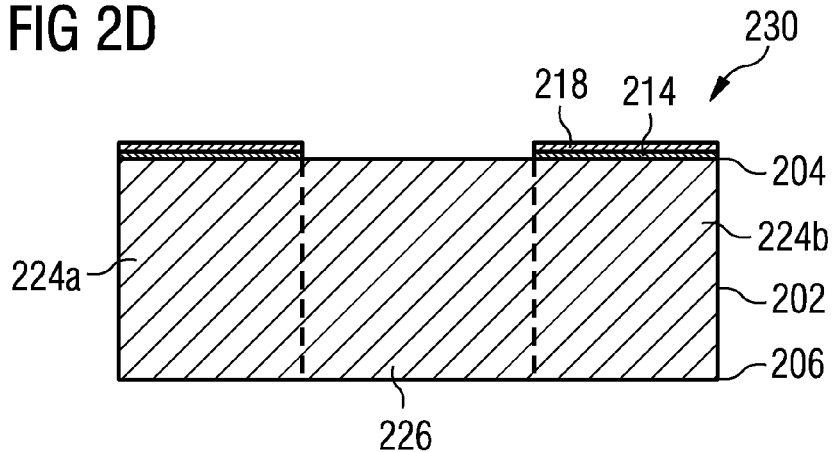
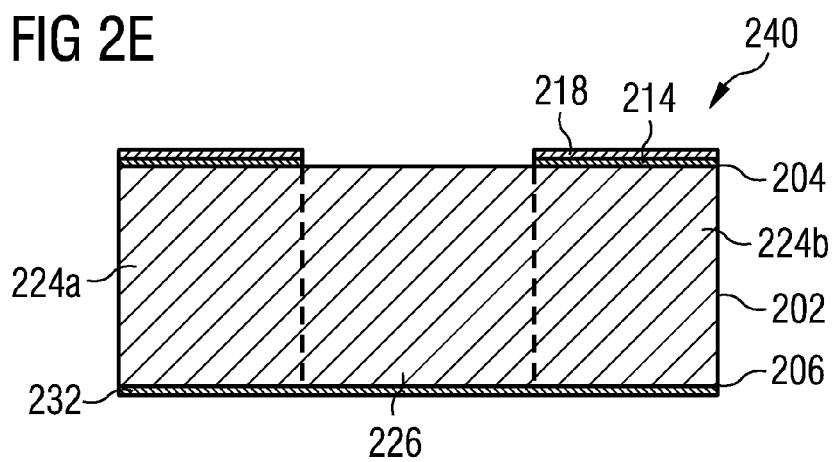
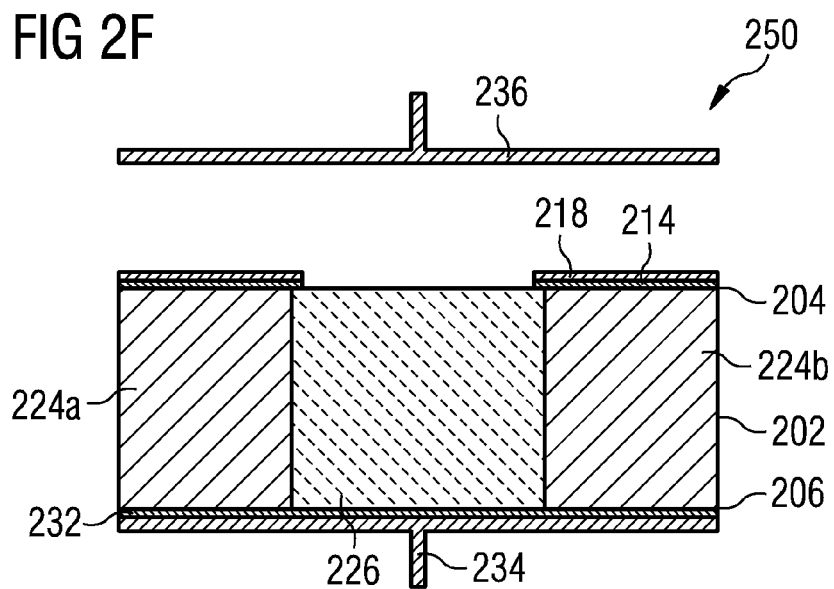

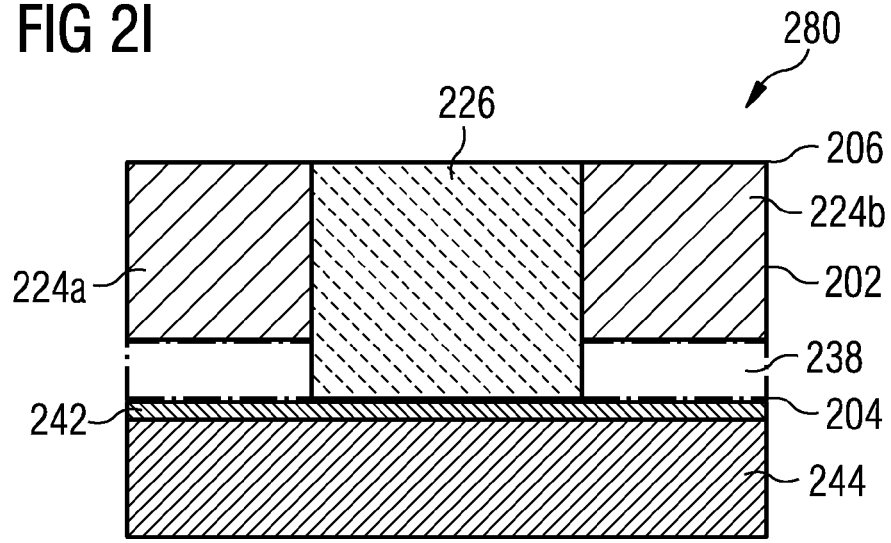
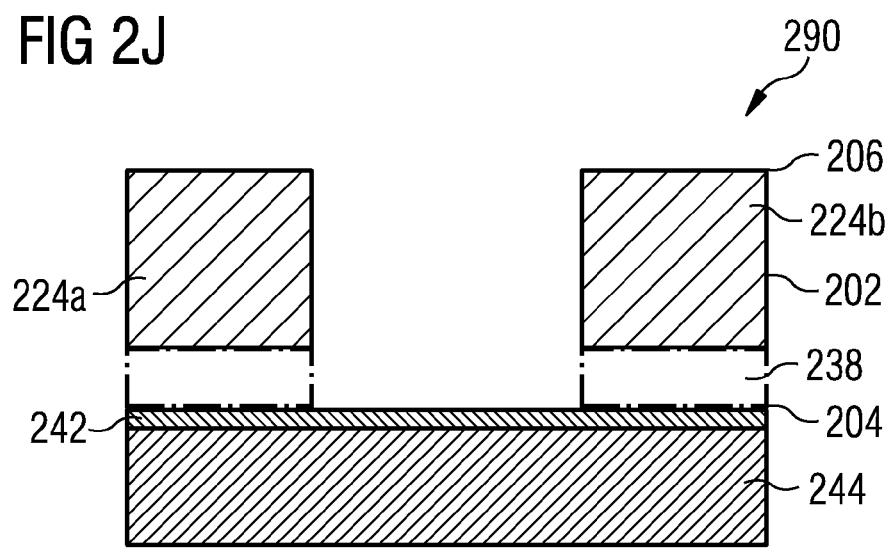

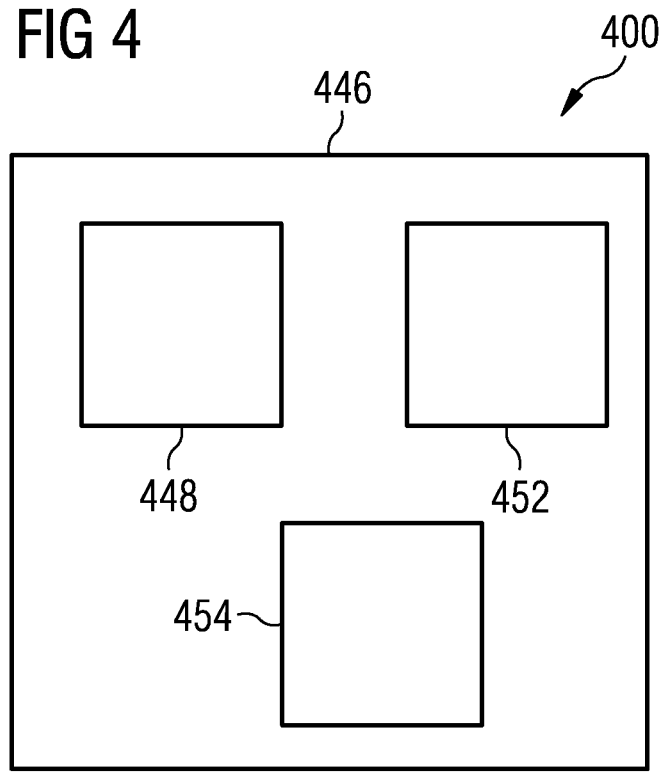

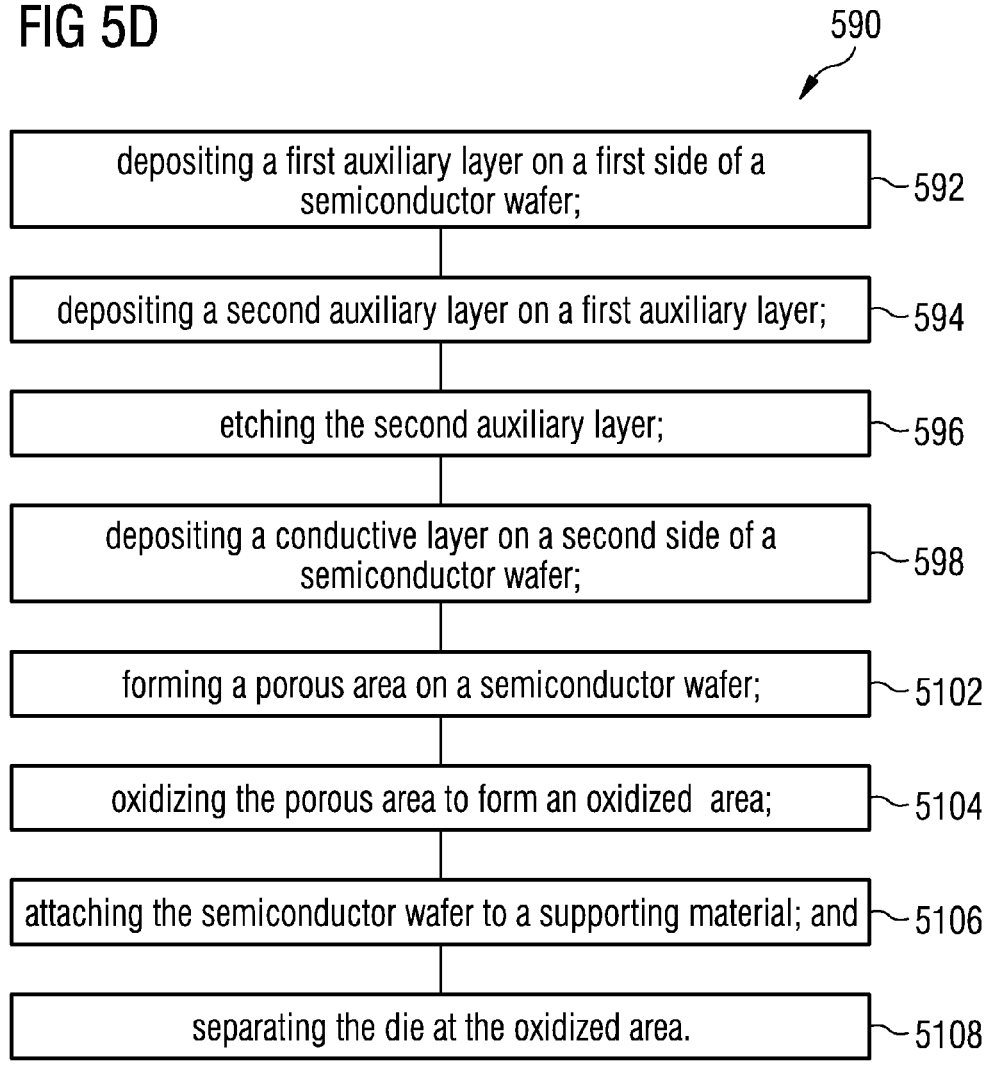

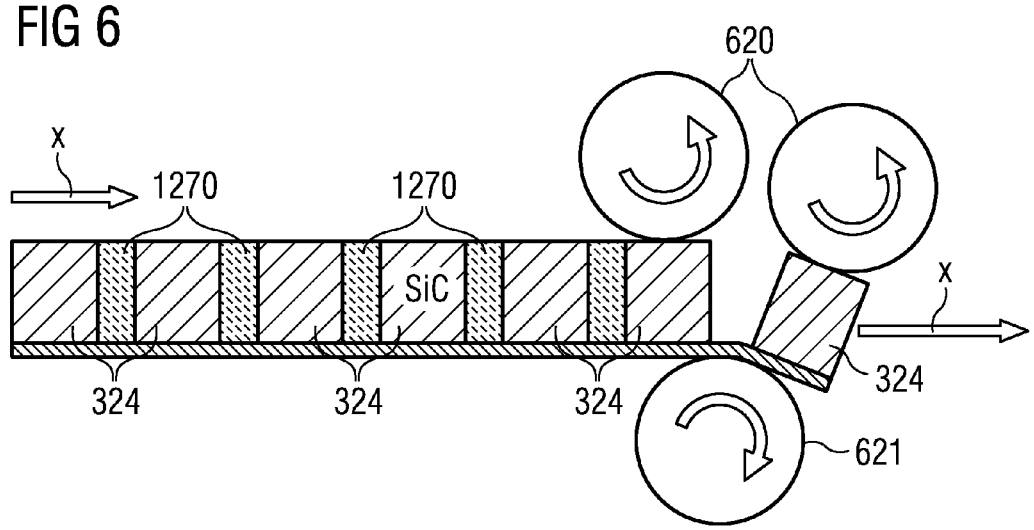

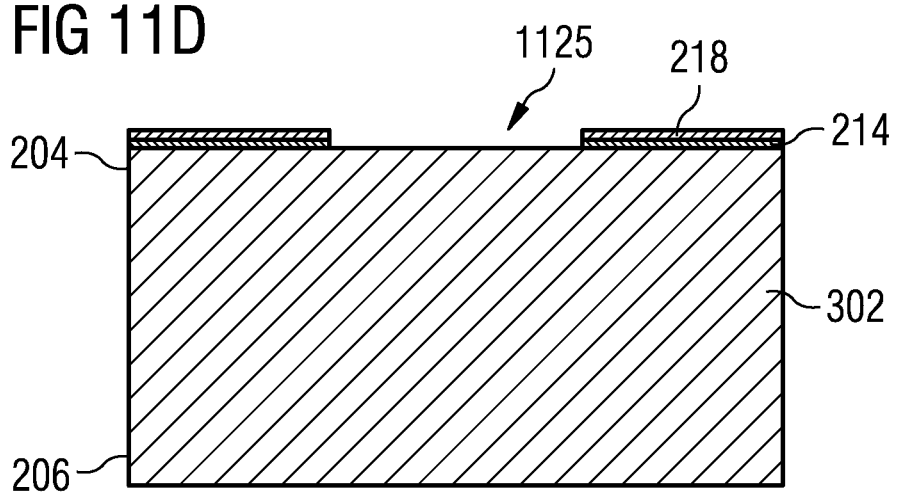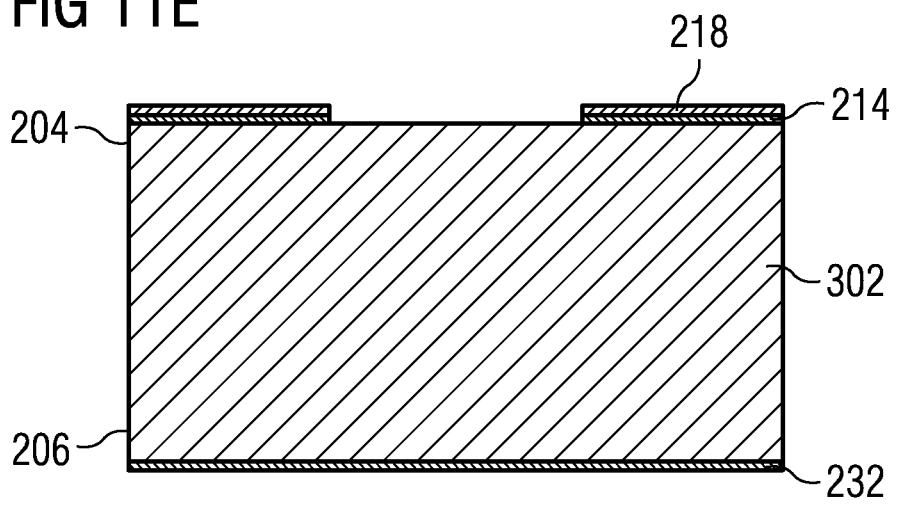

METHOD OF SEPARATING SEMICONDUCTOR DIE USING MATERIAL MODIFICATION

CROSS-REFERENCE TO RELATED APPLICATIONS

This application is a continuation in part (CIP) of U.S. patent application Ser. No. 13/290,197, entitled "METHOD FOR SEPARATING A PLURALITY OF DIES AND A PROCESSING DEVICE FOR SEPARATING A PLURALITY OF DIES" filed on Nov. 7, 2011. The above application is hereby incorporated by reference in its entirety.

TECHNICAL FIELD

Various embodiments relate generally to a method for separating a plurality of dies and a processing device for separating a plurality of dies.

Various embodiments relate to methods for separating die contained in a semiconductor wafer and devices created using such methods.

BACKGROUND

Individual semiconductor devices are typically created by fabricating numerous chips, or "die" on a semiconductor substrate, or "wafer." The process of die creation is called "wafer processing." Following the completion of wafer-level processing, the completed wafers are separated into many individual die, through a process called "dicing." The dicing process typically involves cutting through the wafer using a rotary blade saw. This process requires special equipment including, for instance, diamond impregnated saw blades, which have a limited lifetime. In addition, because of the limitations inherent in such a mechanical process, defects such as cracks sometimes appear at the edges of the die. Because of the very small size of the die, which could be 200 μm or less per side, the cracks could propagate into the active regions of the device. Moreover, the saw-blade cutting process is time-consuming and results in high material losses, through the creation of a kerf by the saw blade. Finally, the sawing process typically requires some type of coolant be applied during sawing. The coolant and residual particles from the sawing process must be cleaned off of the wafer surface after sawing. This exposes the completed die to potential liquid contaminants. As a result, the current die separation process is expensive and may impact the quality or even the functionality of the chip. This is especially true with respect to mechanically stable substrate materials such as silicon carbide (SiC). It is, therefore, desirable to find a dicing process based on currently-used unit processes and which is inexpensive and does not negatively impact the quality of the die.

Currently, mechanical sawing is used for the separation of semiconductor chips, such as in the wafer dicing of silicon carbide SiC based products, e.g. SiC based chips, e.g. SiC based dies, e.g. chips manufactured on SiC or SiC substrates. The current approach results in extremely high processing costs. Mechanical sawing of SiC may result in damages, e.g. crack formation, which may negatively impact performance and yield. Furthermore, the sawing process is extremely expensive and may impact the quality or even the functionality of the chip. To reduce processing costs and to improve the quality of dies, a novel approach for chip separation of SiC-based chips is proposed.

SUMMARY

Various embodiments provide a method for separating semiconductor die using material modification. The method includes: forming a porous region on a semiconductor wafer; and separating the die at the porous region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2J show a method for separating a plurality of dies according to an embodiment;

FIG. 4 shows a processing device for separating a plurality of dies according to an embodiment;

FIG. 5A to 5D show methods for separating semiconductor die according to various embodiments;

FIG. 6 illustrates an embodiment in the method for separating semiconductor die using material modification;

FIGS. 11A to 11H illustrate stages in a method for separating semiconductor die using material modification;

DETAILED DESCRIPTION

Figure 1:
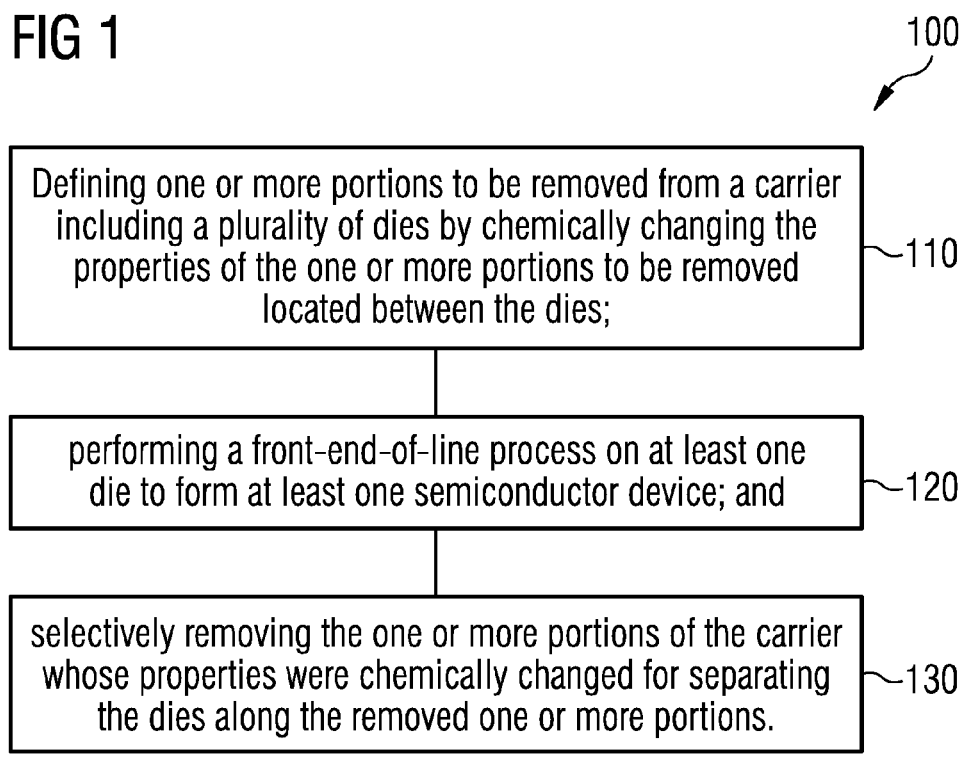
FIG. 1 shows a method for separating a plurality of dies according to an embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

In various embodiments, the attached description shows a process for the separation of individual die from a wafer upon which a plurality of devices have been fabricated. As such, certain process steps including certain substrate materials will be shown to illustrate the creation of the devices. In general, however, the specific process steps and materials used to create the individual devices will not affect the applicability of the separation methods disclosed herein, and as such, should not be interpreted as limiting the disclosure. The process described is of general applicability to many different types fabricated devices and materials, and thus the described process is used only for convenience. The wafer substrate preparation method disclosed is similar to that disclosed by Chang, et al., in "Electrochemical Etching of n-Type 6-H— SiC Without UV Illumination," *J. of Microelectromechanical Sys.*, Vol. 15 (3), June 2006, 548-52. Various embodiments relate to an approach to separate chips, e.g. silicon chips, e.g. silicon carbide chips, e.g. chips based on SiC technology. Chip separation may be carried out based on unit processes, e.g. deposition processes, wet chemical etching, electrochemical processes, and plasma etch processes, which avoid crack formation.

Whilst kerf regions are destroyed, e.g. sawed through, during conventional mechanical sawing processes, various embodiments relate to chemically changing kerf regions, and selectively removing the kerf regions, whose properties were chemically changed for separating the dies, without mechanically sawing the kerf regions.

Various embodiments relate to an approach for separating SiC substrates, based on electrochemical etching i.e. the electrochemical separation of SiC, of portions between dies.

Various embodiments relate to the application of electrochemical etching of SiC for chip separation to replace the mechanical sawing process, thus eliminating mechanical sawing damage.

Various embodiments provide a novel approach for separating dies, which defines portions of the die and chemically changes kerf regions for selective removal, before the completion of front-end-of-line processes; thus the process differs from conventional wafer dicing processes wherein die separation is the carried out after all front-end-of-line processes are completed.

FIG. 1A shows a method for separating a plurality of dies according to an embodiment.

The method includes: defining one or more portions to be removed from a carrier including a plurality of dies by chemically changing the properties of the one or more portions to be removed located between the dies (in 110); performing a front-end-of-line FEOL process on at least one die to form at least one semiconductor device (in 120); and selectively removing the one or more portions of the carrier whose properties were chemically changed for separating the dies along the removed one or more portions (in 130).

FIGS. 2A to 2J show a method for separating a plurality of dies according to an embodiment.

Carrier 202 may include a semiconductor wafer, e.g. a semiconductor substrate, e.g. a semiconductor substrate. Carrier 202 may include silicon. Carrier 202 may include silicon carbide. Carrier 202 may include a plurality of dies, wherein the plurality of dies may be formed within carrier 202. Carrier 202 may include a first carrier side 204 and a second carrier side 206, wherein first carrier side 204 may be configured to face a direction 208 opposite to a direction 212 which second carrier side 206 faces.

In FIG. 2A, first layer 214, e.g. an auxiliary first layer 214, may be formed over first carrier side 204. First layer 214 may be formed over, e.g. directly on, first carrier side 204. Second layer 216, e.g. an auxiliary second layer 216, may be formed over second carrier side 206. Second layer 216 may be formed over, e.g. directly on, second carrier side 206. First layer 214 and second layer 216 may be formed, e.g. deposited, in a single step. First layer 214 may be deposited, e.g. grown over first carrier side 204. Second layer 216 may be deposited, e.g. grown over second carrier side 206. First layer 214 and second layer 216 may include the same material. First layer 214 and second layer 216 may include different materials. First layer 214 and second layer 216 may include silicon dioxide $SiO_2$. First layer 214 and second layer 216 may be deposited by various deposition techniques, e.g. chemical vapor deposition of silicon dioxide, e.g. sputtering, e.g. thermal oxidation.

In FIG. 2B, third layer 218, e.g. an auxiliary third layer 218, may be formed over first carrier side 204. Third layer 218 may be formed over, e.g. directly on, first layer 214. Fourth layer 222, e.g. an auxiliary fourth layer 222, may be formed over second carrier side 206. Fourth layer 222 may be formed over, e.g. directly on, second layer 216. Third layer 218 and fourth layer 222 may be formed in a single step. Third layer 218 may be deposited, e.g. grown, directly on first layer 214. Fourth layer 222 may be deposited, e.g. grown, directly on second layer 216. Third layer 218 and fourth layer 222 may include the same material. Third layer 218 and fourth layer 222 may include polysilicon.

Carrier 202 may include a plurality of dies 224a, 224b. Two dies 224a, 224b are shown in the figures, however, the plurality of dies is not limited to two but may include one or more dies, e.g. three, four, five, six, seven, eight, nine, ten or even more dies such as tens or hundreds of dies. Each die 224a, 224b may be defined by a length×breadth dimension, e.g. each die 224a, 224b may include a 200 μm×200 μm die, e.g. each die 224a, 224b may include a 300 μm×300 μm die. One or more portions to be removed 226 from carrier 202 may be defined by chemically changing the properties of the one or more portions to be removed 226. The one or more portions to be removed 226 may be located between the dies 224a, 224b.

In FIG. 2C, masking layer 228, which may include a photoresist layer, may be formed over first carrier side 204. Masking layer 228 may be formed over first carrier side 204, e.g. photoresist layer 228 may be formed directly on third layer 218, e.g. photoresist layer 228 may be formed over first layer 214.

Masking layer 228 may be configured to allow the one or more portions 226 to be chemically changed and to shield dies 224a, 224b from being chemically changed. The properties of the one or more portions to be removed 226 located between dies 224a, 224b may be chemically changed, whereas dies 224a, 224b may be shielded from being chemically changed. Masking layer 228 may be configured to allow portions of first layer 214 and third layer 218 formed over one or more portions 226 to be removed and to shield portions of first layer 214 and third layer 218 formed over dies 224a, 224b from being removed.

Masking layer 228 may be processed using photolithography to form an etch mask, which exposes the portions of third layer 218 formed over one or more portions 226, to a following etch step, and which protects the portions of third layer 218 formed over plurality of dies 224a, 224b, from a following etch step.

Portions of third layer 218 formed over one or more portions 226 may be removed. Fourth layer 222 formed over second carrier side 206 may be removed. Etching, e.g. plasma etching, e.g. chemical etching, may be carried out to removed portions of third layer 218 formed over one or more portions 226 and fourth layer 222 formed over second carrier side 206.

Masking layer 228 may form an etch mask, which exposes the portions of first layer 214 formed over one or more portions 226, to a following etch step, and which protects the portions of first layer 214 formed over plurality of dies 224a, 224b, from a following etch step.

Portions of first layer 214 formed over one or more portions 226 may be removed. Second layer 216 formed over second carrier side 206 may be removed. Etching, e.g. plasma etching, e.g. chemical etching, may be carried out to removed portions of first layer 214 formed over one or more portions 226 and second layer 216 formed over second carrier side 206. Etching of third layer 218, first layer 214, second layer 216 and fourth layer 222 may be carried out in a single step or in separate etching steps.

In FIG. 2D, after removal of portions of third layer 218 and first layer 214 formed over first carrier side 204, and second layer 216 and fourth layer 222 formed over second carrier side 206, masking layer 228 may be removed, e.g. chemically removed, e.g. chemically dissolved. Portions of first layer 214 and third layer 218 may remain over plurality of dies 224a, 224b of carrier 202.

The properties of the one or more portions to be removed 226 may be chemically changed, e.g. electrochemically changed. The properties of one or more portions to be removed 226 may be chemically changed by an etching process, e.g. electrochemically etching the one or more portions to be removed 226 in an electrolyte solution.

In FIG. 2E, an electrically conductive layer 232, e.g. an electrically conductive layer including nickel, may be deposited over, e.g. directly on, second carrier side 206. Electrically conductive layer 232 may serve as an electrode. Electrically conductive layer 232 may include a metal, a metal compound, a metal alloy. Wherein electrically conductive layer 232 may include at least one of copper and iron, e.g. compounds including at least one of copper and iron, e.g. alloys including at least one of copper and iron, then deposition of a diffusion bather, e.g. Ti, e.g. TiN, e.g. Ta, e.g. TaN, over side 206, may be carried out, prior to the deposition of electrically conductive layer 232. The diffusion bather may be deposited between side 206 and electrically conductive layer 232 e.g. directly on side 206, to prevent the diffusion of at least one of copper and iron, into side 206.

Chemically changing the properties of the one or more portions to be removed 226 may include electrochemically converting the one or more portions to be removed into a porous material.

In FIG. 2F, electrochemical etching in an electrolyte, e.g. electrochemical etching in hydrofluoric acid HF, may be carried out, thereby chemically changing the exposed one or more portions 226, to porous silicon carbide SiC by anodization. The one or more portions 226 may be exposed to an electrolyte solution on first carrier side 204. A current, e.g. an electrical current, may be applied through the electrolyte solution between a counter electrode 236 located in the electrolyte solution and a further electrode, e.g. working electrode 234. Working electrode 234 may be electrically connected to the one or more portions to be removed 226 via a second carrier side 206.

Working electrode 234 may be positioned on second carrier side 206. Working electrode 234 may be electrically contacted to electrically conductive layer 232 formed on second carrier side 206. Counter electrode 236 may be positioned by the first carrier side 204, such that carrier 202 lies between working electrode 234 and counter electrode 236. One or more portions to be removed 226 from carrier 202 may be defined by chemically changing the properties of the one or more portions to be removed 226 located between the dies 224a, 224b, e.g. changing one or more portions 226 from silicon carbide to porous silicon carbide using the anodization process.

At least one of the first carrier side 204 and second carrier side 206 may include a front side or back side of a semiconductor wafer. A front side of a semiconductor wafer may include the side of the semiconductor wafer wherein a semiconductor device, e.g. an active device, may be formed. First carrier side 204 may include a semiconductor wafer front side. Second carrier side 206 may include a semiconductor wafer back side.

One or more portions 226 extending through a full height of carrier 202 from first carrier side 204 to second carrier side 206 may be chemically changed, e.g. from silicon carbide to porous silicon carbide. If one or more portions 226 extending through a full height of carrier 202 from first carrier side 204 to second carrier side 206 is chemically changed to porous SiC, i.e. SiC is formed throughout the full height of carrier 202 from first carrier side 204 to second carrier side 206, backside grinding i.e. grinding of second carrier side 206 is avoided later in the backend process.

If one or more portions 226 chemically changed to porous SiC may not extend through a full height of carrier 202 from first carrier side 204 to second carrier side 206 i.e. porous SiC is not formed throughout the full height of carrier 202 from first carrier side 204 to second carrier side 206, backside grinding i.e. grinding of second carrier side 206, may be carried out later in the backend process.

Figure 2G:
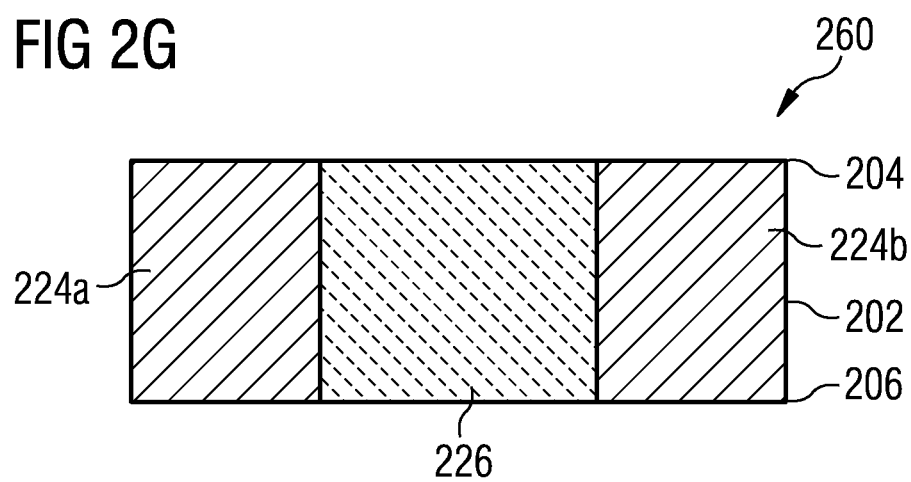

In FIG. 2G, first layer 214 and third layer 218 remaining over plurality of dies 224a, 224b of carrier 202 may be removed, e.g. chemically removed, e.g. etched. Electrically conductive layer 232 may be removed, e.g. chemically removed, e.g. etched. One or more portions to be removed 226 may be thermally oxidized into an oxide material. The properties of one or more portions 226 may be further chemically changed by chemically changing one or more portions 226 from porous silicon carbide to silicon dioxide, e.g. by the thermal oxidation of porous silicon carbide SiC resulting in silicon dioxide $SiO_2$.

Figure 2H:
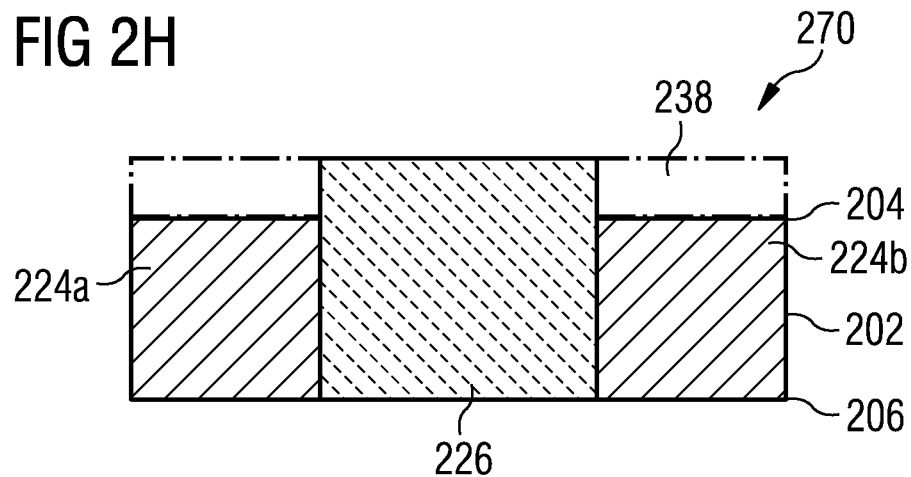

In FIG. 2H, a front-end-of-line FEOL process may be performed on at least one die 224a, 224b to form at least one semiconductor device 238, e.g. a diode, e.g. a transistor, e.g. a bipolar junction transistor, e.g. a field effect transistor, e.g. a resistor, e.g. a capacitor, e.g. an inductor, e.g. a thyristor. A front-end-of-line FEOL process includes at least one process used to form the active electrical components of the semiconductor device. A front-end-of-line FEOL process includes performing a front-end-of-line FEOL process on a front side of a semiconductor wafer.

In current dicing methods, all front-end-of-line processes are completed, before defining portions of the wafer for dicing, i.e. before mechanical sawing takes place. According to various embodiments, the wafer, e.g. carrier 202, is defined into die areas 224a, 224b, and portions to be removed are chemically changed for separating the dies 224a 224b, before the front-end-of-line processes are completed.

Carrier 202 may be mounted over a support before selectively removing the one or more portions 226 of carrier 202 whose properties were chemically changed for separating the dies 224a, 224b along the removed one or more portions 226.

In FIG. 2I, carrier 202 may be mounted onto a supporting material 242, e.g. an adhesive tape, e.g. a foil. First carrier side 204 may be placed over supporting material 242, such that supporting material 242 may hold carrier 202. Supporting material 242 may hold dies 224a, 224b from a first carrier side 204 when separated. Supporting material 242 may be additionally supported by further supporting material 244, which may include a platform.

In FIG. 2J, one or more portions 226 of carrier 202 whose properties were chemically changed may be selectively removed for separating the dies along the removed one or more portions 226. One or more portions 226 may be selectively removed by etching, e.g. plasma etching, e.g. chemical etching, e.g. chemical etching with buffered hydrofluoric acid.

The removal of one or more portions 226, i.e. kerf portions, which include silicon dioxide leaves separated dies 224a, 224b, i.e. chips, on supporting material 242.

One or more portions 226 may even be removed by mechanical sawing, resulting in a reduction or even elimination of crack formation and of chipping compared to mechanical sawing of chemically unchanged SiC. If one or more portions 226 were to be removed by mechanical sawing, one or more portions 226, i.e. the kerf regions for mechanical sawing, may have to be sufficiently wide to accommodated the width of the sawing blade. Inspection of the edges of dies 224a, 224b, e.g. by microscopy, e.g. scanning electron microscopy, shows that chip separation carried out by novel separation approach incurs no sawing damage and no cracks.

Figure 3A:
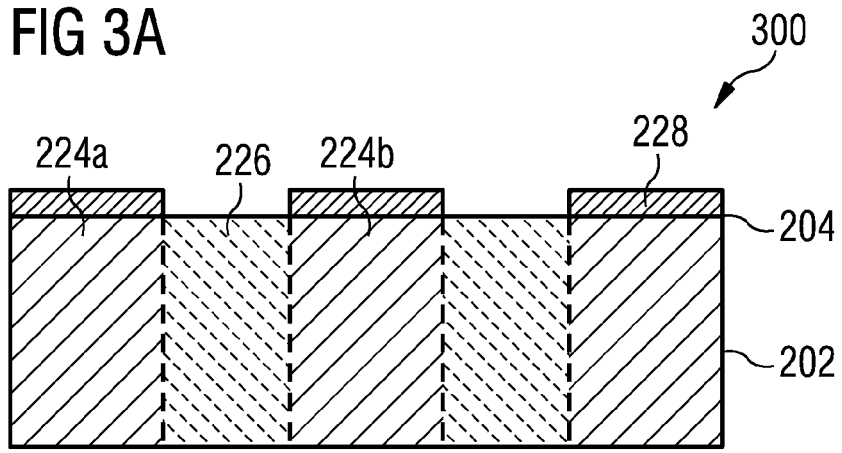
FIGS. 3A to 3C show a method for separating a plurality of dies according to an embodiment.
Figure 3B:
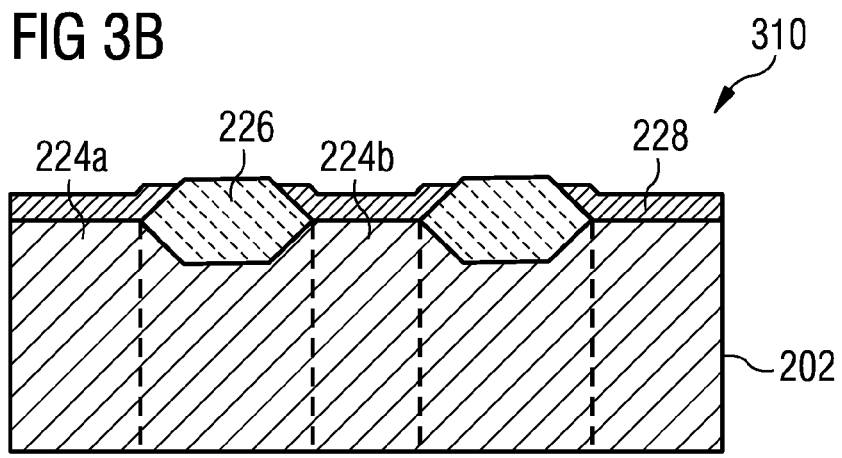

FIGS. 3A to 3B show a method for separating a plurality of dies according to another embodiment. Identical features as to those described with respect to the method of FIGS. 1 and 2A to 2J are denoted with the same reference signs.

Carrier 202 may include silicon. In FIG. 3A, masking layer 228, which may include a silicon nitride layer, may be formed over first carrier side 204. Masking layer 228 may be formed over a first carrier side. Masking layer 228 may be configured to allow the one or more portions 226 to be chemically changed and to shield dies 224a, 224b from being chemically changed.

As with previous embodiments earlier described, the properties of the one or more portions to be removed 226 located between dies 224a, 224b may be chemically changed, whereas dies 224a, 224b may be shielded from being chemically changed. Chemically changing the properties of the one or more portions to be removed 226 may include electro-chemically changing the properties of the one or more portions to be removed 226.

However, the one or more portions 226 to be chemically changed may be chemically changed using a local oxidation of silicon LOCOS process. Using a LOCOS process, one or more portions 226 of carrier 202 may be thermally oxidized to form silicon dioxide. The LOCOS process, i.e. thermal oxidation may be carried out from first carrier side 204. According to another embodiment, a separation by implantation of oxygen SIMOX process from first carrier side 204 may be used to chemically change one or more portion 226 from silicon to silicon dioxide.

As shown in FIG. 3B, one or more portions 226 chemically changed to silicon dioxide from a LOCOS process may have a height, e.g. a height ranging from between about 0.1 μm to about 0.5 μm, e.g. about 0.2 μm to about 0.4 μm, extending from first carrier side 204 into carrier 202 towards second carrier side 206. Therefore, as one or more portions 226 chemically changed to silicon dioxide may not extend through a full height of carrier 202 from first carrier side 204 to second carrier side 206 i.e. silicon dioxide is not formed throughout the full height of carrier 202 from first carrier side 204 to second carrier side 206, backside grinding i.e. grinding of second carrier side 206, may be carried out later in the backend process.

Figure 3C:
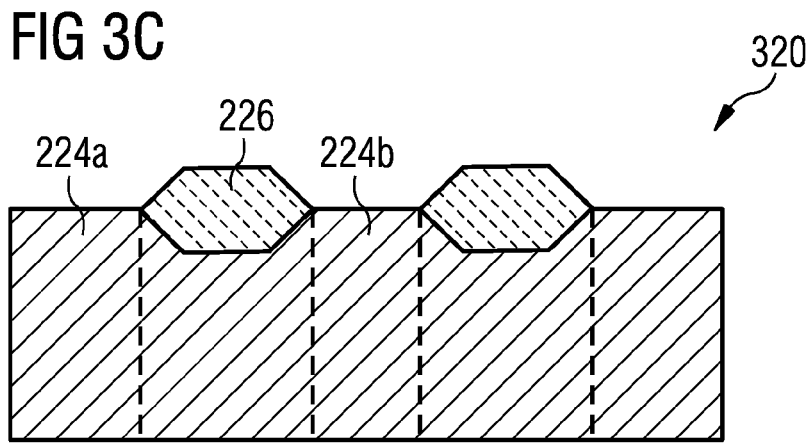

In FIG. 3C, mask layer 228 may be removed. A front-end-of-line FEOL process may be performed on at least one die 224a, 224b to form at least one semiconductor device 238, e.g. a diode, e.g. a transistor, e.g. a bipolar junction transistor, e.g. a field effect transistor, e.g. a resistor, e.g. a capacitor, e.g. an inductor, e.g. a thyristor. A front-end-of-line FEOL process includes at least one process used to form the active electrical components of the semiconductor device. A front-end-of-line FEOL process includes performing a front-end-of-line FEOL process on a front side of a semiconductor wafer.

Carrier 202 may be mounted over a support before selectively removing the one or more portions 226 of carrier 202 whose properties were chemically changed for separating the dies 224a, 224b along the removed one or more portions 226.

Carrier 202 may be mounted onto a supporting material 242, such as that described with respect to FIG. 2J. First carrier side 204 may be placed over supporting material 242, such that supporting material 242 may hold carrier 202. Supporting material 242 may hold dies 224a, 224b from a first carrier side 204 when separated. Supporting material 242 may be additionally supported by further supporting material 244, which may include a platform.

One or more portions 226 of carrier 202 whose properties were chemically changed may be selectively removed for separating the dies along the removed one or more portions 226. One or more portions 226 may be selectively removed by etching, e.g. plasma etching, e.g. chemical etching, e.g. chemical etching with buffered hydrofluoric acid.

The removal of one or more portions 226, i.e. kerf portions, which include silicon dioxide leaves separated dies 224a, 224b, i.e. chips, on supporting material 242.

In FIG. 4, a processing device 446 for separating a plurality of dies 224a, 224b is provided. Processing device 446 may include a selection apparatus 448 configured to define one or more portions 226 to be removed from carrier 202 including a plurality of dies 224a, 224b by chemically changing the properties of the one or more portions 226 to be removed located between the dies; process apparatus 452 configured to perform a front-end-of-line FEOL process on at least one die 224a, 224b to form at least one semiconductor device 238; and removal apparatus 454 configured to selectively remove the one or more portions 226 of carrier 202 whose properties were chemically changed for separating the dies 224a, 224b along the removed one or more portions. Selection apparatus 448 may be configured to define one or more portions 226 to be removed from carrier 202 including a plurality of dies 224a, 224b by chemically changing the properties of the one or more portions 226 to be removed located between the dies 224a, 224b, according to the method described with respect to FIGS. 1, 2A to 2J, and 3A to 3C. Process apparatus 452 may be configured to perform a front-end-of-line FEOL process on at least one die 224a, 224b to form at least one semiconductor device 238 according to the method described with respect to FIGS. 1, 2A to 2J, and 3A to 3C. Removal apparatus 454 may be configured to selectively remove the one or more portions 226 of carrier 202 whose properties were chemically changed for separating the dies 224a, 224b along the removed one or more portions according to the method described with respect to FIGS. 1, 2A to 2J, and 3A to 3C.

A method for separating a plurality of dies is provided according to various embodiments. The method may include defining one or more portions to be removed from a carrier including a plurality of dies by chemically changing the properties of the one or more portions to be removed located between the dies; performing a front-end-of-line FEOL process on at least one die to form at least one semiconductor device; and selectively removing the one or more portions of the carrier whose properties were chemically changed for separating the dies along the removed one or more portions.

According to an embodiment, defining one or more portions to be removed from a carrier includes chemically changing the properties of the one or more portions to be removed located between the dies and shielding the dies from being chemically changed.

According to an embodiment, chemically changing the properties of the one or more portions to be removed includes electrochemically changing the properties of the one or more portions to be removed.

According to an embodiment, chemically changing the properties of one or more portions to be removed includes chemically changing the properties of the one or more portions to be removed by an etching process.

According to an embodiment, chemically changing the properties of the one or more portions to be removed includes electrochemically etching the one or more portions to be removed in an electrolyte solution.

According to an embodiment, chemically changing the properties of the one or more portions to be removed includes electrochemically converting the one or more portions to be removed into a porous material.

According to an embodiment, defining one or more portions to be removed from a carrier includes forming at least one layer over a first carrier side and configuring the layer to allow the one or more portions to be chemically changed and to shield the dies from being chemically changed.

According to an embodiment, defining one or more portions to be removed from a carrier includes exposing the one or more portions to an electrolyte solution on a first carrier side and applying a current through the electrolyte solution between an electrode located in the electrolyte solution and a further electrode electrically connected to the one or more portions to be removed via a second carrier side.

According to an embodiment, defining one or more portions to be removed from a carrier includes thermally oxidizing the one or more portions to be removed into an oxide material.

According to an embodiment, defining one or more portions to be removed from a carrier includes chemically changing the one or more portions, each portion extending between a first carrier side and a second carrier side, wherein at least one of the first carrier side and second carrier side includes a front side or back side of a semiconductor wafer.

According to an embodiment, defining one or more portions to be removed from a carrier includes chemically changing the one or more portions, each portion extending through a full height of the carrier from a first carrier side to a second carrier side, wherein at least one of the first carrier side and second carrier side includes a front side or back side of a semiconductor wafer.

According to an embodiment, performing a front-end-of-line FEOL process on at least one die to form at least one semiconductor device includes performing a front-end-of-line FEOL process on at least one die to form at least part of at least one device from the following group of devices, the group consisting of: a diode, a transistor, a bipolar junction transistor, a field effect transistor, a resistor, a capacitor, and inductor and a thyristor.

According to an embodiment, performing a front-end-of-line FEOL process on at least one die to form at least one semiconductor device includes at least one process used to form the active electrical components of the semiconductor device.

According to an embodiment, performing a front-end-of-line FEOL process on at least one die to form at least one semiconductor device includes performing a front-end-of-line FEOL process on a front side of a semiconductor wafer.

According to an embodiment, the method further includes mounting the carrier over a support before selectively removing the one or more portions of the carrier whose properties were chemically changed for separating the dies along the removed one or more portions.

According to an embodiment, selectively removing the one or more portions of the carrier whose properties were chemically changed includes selectively removing the one or more portions of the carrier by chemical etching.

According to an embodiment, selectively removing the one or more portions of the carrier whose properties were chemically changed includes selectively removing the one or more portions of the carrier by plasma etching.

According to an embodiment, defining one or more portions to be removed from a carrier including a plurality of dies includes defining one or more portions to be removed from a carrier including at least one material from the following group of materials, the group consisting of: silicon and silicon carbide.

A processing device for separating a plurality of dies is provided. The processing device may include a selection apparatus configured to define one or more portions to be removed from a carrier including a plurality of dies by chemically changing the properties of the one or more portions to be removed located between the dies; a process apparatus configured to perform a front-end-of-line FEOL process on at least one die to form at least one semiconductor device; and a removal apparatus configured to selectively remove the one or more portions of the carrier whose properties were chemically changed for separating the dies along the removed one or more portions.

Various embodiments provide a process for chip separation of dies, e.g. silicon carbide dies and an alternative to plasma dicing and mechanical sawing for damage-free separation of dies, e.g. silicon carbide dies, from a wafer.

Figure 5A:
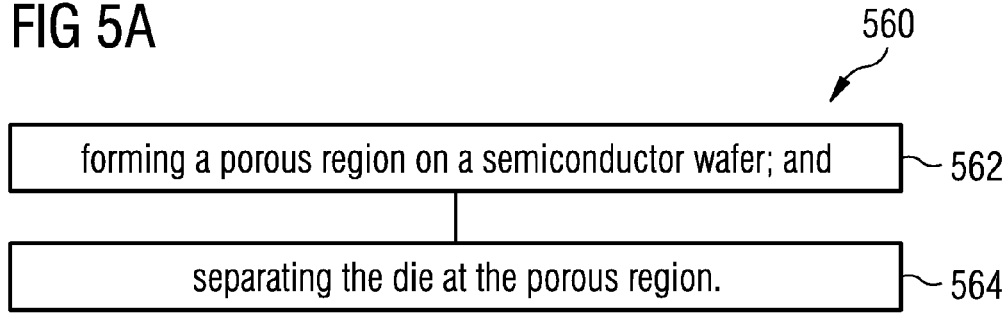

FIG. 5A shows method 560 for separating semiconductor die according to an embodiment. The method includes:
forming a porous region on a semiconductor wafer (in 562); and
separating the die at the porous region (in 564).

Figure 5B:
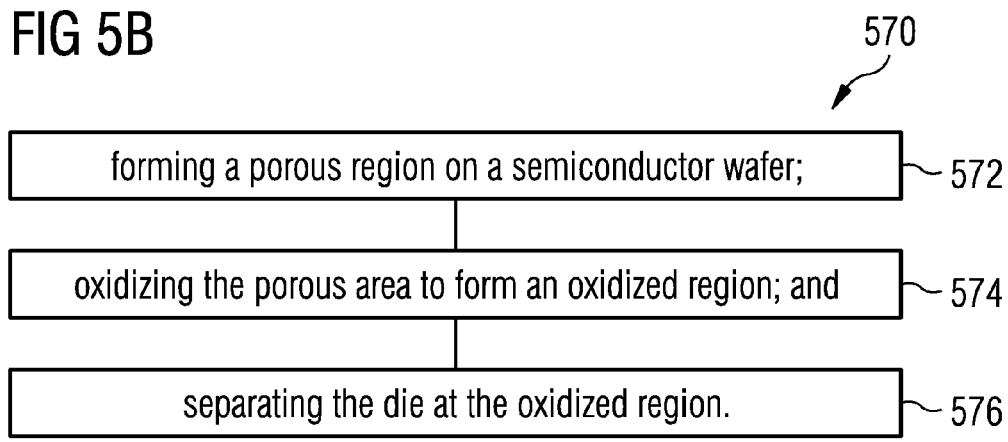

FIG. 5B shows method 570 for separating semiconductor die according to an embodiment. The method includes:
forming a porous region on a semiconductor wafer (in 572);
oxidizing the porous area to form an oxidized region (in 574); and
separating the die at the oxidized region (in 576).

Figure 5C:
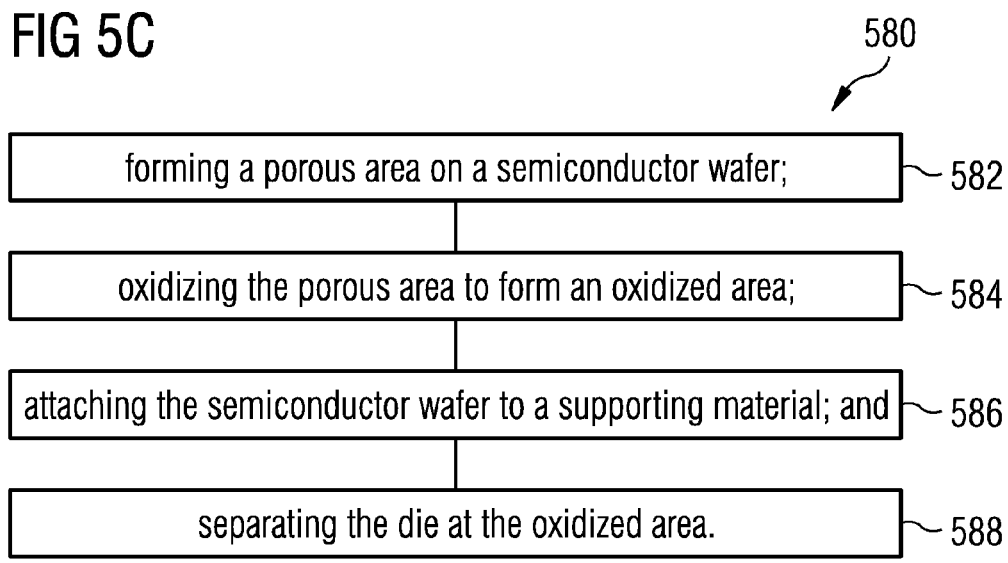

FIG. 5C shows method 580 for separating semiconductor die according to an embodiment. The method includes:
forming a porous area on a semiconductor wafer (in 582);
oxidizing the porous area to form an oxidized area (in 584);
attaching the semiconductor wafer to a supporting material (in 586); and
separating the die at the oxidized area (in 588).

FIG. 5D shows method 590 for separating semiconductor die according to an embodiment. The method includes:
depositing a first auxiliary layer on a first side of a semiconductor wafer (in 592);
depositing a second auxiliary layer on the first auxiliary layer (in 594);

etching the second auxiliary layer (in 596);

depositing a conductive layer on a second side of a semiconductor wafer (in 598);

forming a porous area on a semiconductor wafer (in 5102);

oxidizing the porous area to form an oxidized area (in 5104);

attaching the semiconductor wafer to a supporting material (in 5106); and separating the die at the oxidized area (in 5108).

FIGS. 11A to 11H show a method for separating semiconductor die according to an embodiment. FIGS. 11A to 11H may include all the functionalities of the features described according to the method of FIGS. 2A to 2H.

Figure 11A:
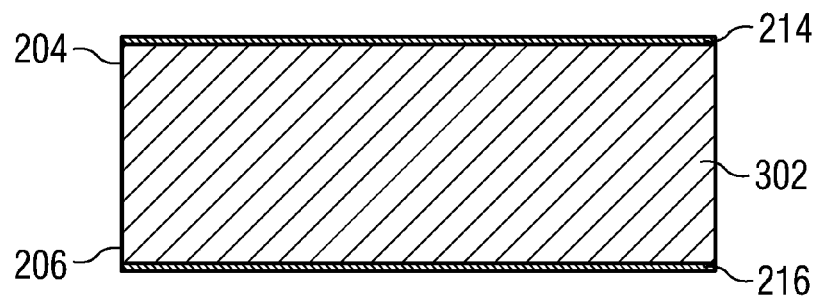

FIG. 11a illustrates a semiconductor carrier 302 including a first side 204 and a second side 206. In this example, carrier 302 includes SiC. In principle, however, the carrier 302 could include other semiconductor materials known in the art for such purposes including, but not limited to, silicon.

Prior to beginning device fabrication carrier 302, which may include a semiconductor wafer 302, is cleaned using known techniques such as, for example, a two-part RCA clean. In this process, the carrier 302 is first exposed to a mixture of deionized water, hydrogen peroxide, and ammonium hydroxide, with mild heating. The second cleaning step uses a mixture of deionized water, hydrogen peroxide, and hydrochloric acid. The relative ratios of the various chemical constituents will vary, depending on the process and the carrier material used. After completion of the two-part cleaning process, these steps may or may not be followed by a hydrofluoric acid (HF) etch to remove any remaining native oxides.

Once the cleaning process is complete, the carrier 302 then has an oxide auxiliary layer 214, 216 applied using techniques known in the art. In this example, the auxiliary layer 214, 216 is grown using a wet thermal oxidation process, using water in the form of steam as the oxide source. In an embodiment, the oxidation is performed using a temperature range of between 900-1200 C. In this example, the oxide is grown to a thickness of between 0.2 and 1.0 μm. In another embodiment, dry oxidation is performed, using oxygen as an oxidation source. A third alternative combines both wet and dry oxidation techniques—the dry-wet-dry oxidation cycle. This method has the advantage of producing higher-quality oxide films, while retaining the higher film growth speeds of the wet thermal oxidation technique. However, the oxidation method used is dependent on the layer properties desired, as well as process and material-specific requirements, and the die separation method disclosed herein is not dependent on the method used to create auxiliary layer 214, 216.

Figure 11B:
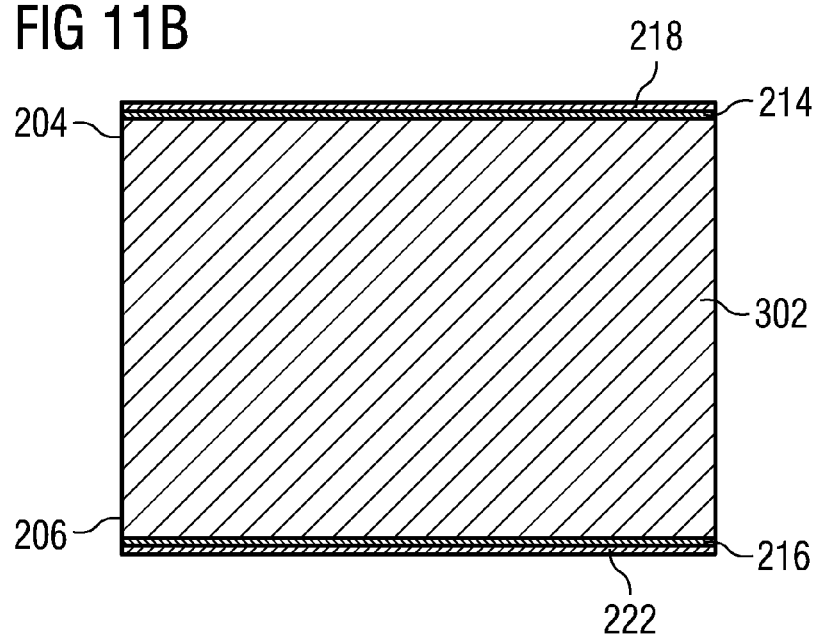

Following the formation of auxiliary layer 214, 216, a second auxiliary layer 218, 222 is deposited, as illustrated in FIG. 11B. Second auxiliary layer 218, 222 is used together with the first auxiliary layer 214, 216 as a mask for a later etch process. Second auxiliary layer 218, 222 is formed from, for example, polysilicon. The polysilicon layer is deposited using known processes. In one embodiment, the polysilicon is deposited using low pressure chemical vapor deposition (LPCVD). Other known processes may be used for the deposition of the polysilicon layer, including, without limitation, plasma-enhanced chemical vapor deposition (PECVD), as the die separation disclosed herein is not dependent on the deposition method used. Deposition temperatures for LPCVD of polysilicon typically range from 580 to 650 C. Silane is one preferred source gas. The silane may or may not include a secondary carrier gas, such as $N_2$ or $H_2$.

Figure 11C:
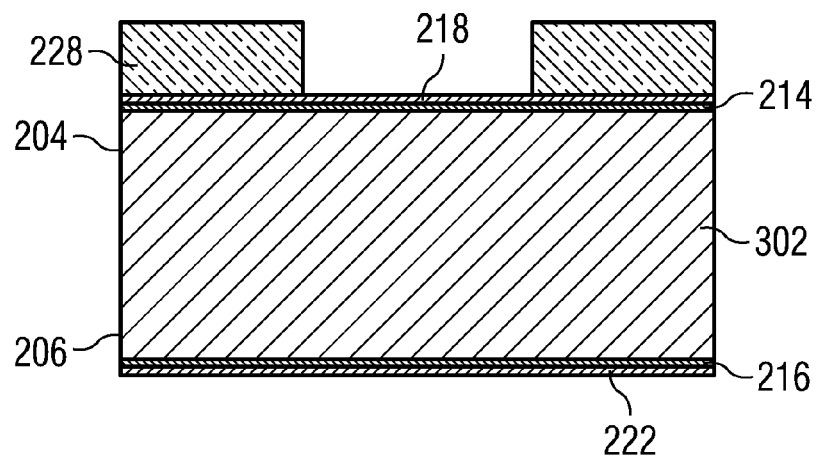

A resist layer 228 is next deposited on the second auxiliary layer 218, as illustrated in FIG. 11C. Resist layer 228 may be a positive resist or a negative resist. In this example, a positive resist is used. An optional cleaning step may be included before resist layer 228 is deposited on first side 204 of the carrier 302. After the optional cleaning step, and before resist deposition, an adhesion promoter, such as hexamethyldisilazane (HMDS) may be applied to aid in adhesion between the photoresist and the underlying wafer surface. Resist layer 228 is deposited on second auxiliary layer 218 using, for example, a spin-on process. In principle, other resist application processes will be applicable, as the photoresist application process is not relevant to the disclosed die separation method. Examples of potentially useful photoresist application processes include spraying or a foil-laminate process. The applied photoresist thickness is, for example, between 0.5-2.5 μm thick. However, the thickness of the photoresist applied is not critical to this process, and the thickness of photoresist applied may deviate widely from this range. Following deposition, the photoresist is cured. In one embodiment, the curing step involves heating the wafer to a temperature in the range 80-110 C, for 30 to 60 seconds. The curing characteristics will vary depending on the photoresist used, however, and the disclosed die separation process is not limited by the temperature used.

After curing, the resist is exposed and developed. The exposure step involves masking procedures known in the art. A mask, not shown, is aligned over the photoresist layer 228. The area of the photoresist layer that is not covered by the mask is then exposed to light of an appropriate wavelength. In one embodiment, the light used is UV light in the range 365-436 nm. However, the light wavelength used is dependent on process and device, and the current application is not restricted any certain exposure process and wavelength.

Following exposure, the exposed resist is removed using either chemical processes, or more typically, through a dry etch process. Dry etch processes include, for instance, plasma etch. One of skill in the art will recognize that the etching process described in detail herein is what is known as a positive resist process, in that the material solubilized and removed is that which is exposed to the light through the mask. One of skill in the art will also appreciate that if a negative photoresist process is used, the area that was not exposed to light will be soluble and thus will be removed. Following removal of the resist 228 from the exposed areas, the underlying polysilicon second auxiliary layer 218 is exposed in those areas where the resist 228 was removed.

As illustrated in FIGS. 11C and 11D, the exposed second auxiliary layer 218, 222 is then removed. In this embodiment, a dry etch process such as plasma etch or reactive ion etch is used to remove the exposed portion of the second auxiliary layer 218, 222. Following removal of the exposed portion of the second auxiliary layer 218, 222, the exposed portion of the first auxiliarly layer 214, 216 is also removed using a dry etch process. The instant method is not dependent on the auxiliary layer removal method, however, and other removal methods, such as a wet chemical etch, may be applicable. Following removal of the first and second auxiliary layers 214, 216, 218, 222, a channel 1125 is formed over the underlying SiC carrier 302. Once the channel 1125 has been created in the first and second auxiliary layers 214, 218 the remaining resist layer 228 is then removed using methods known in the art. Channel 1125 may include all the features and functionalities of the one or more portions to be removed 226, already described with respect to FIGS. 1, 2A to 2J, 3A to 3C and 4.

Figure 11F:
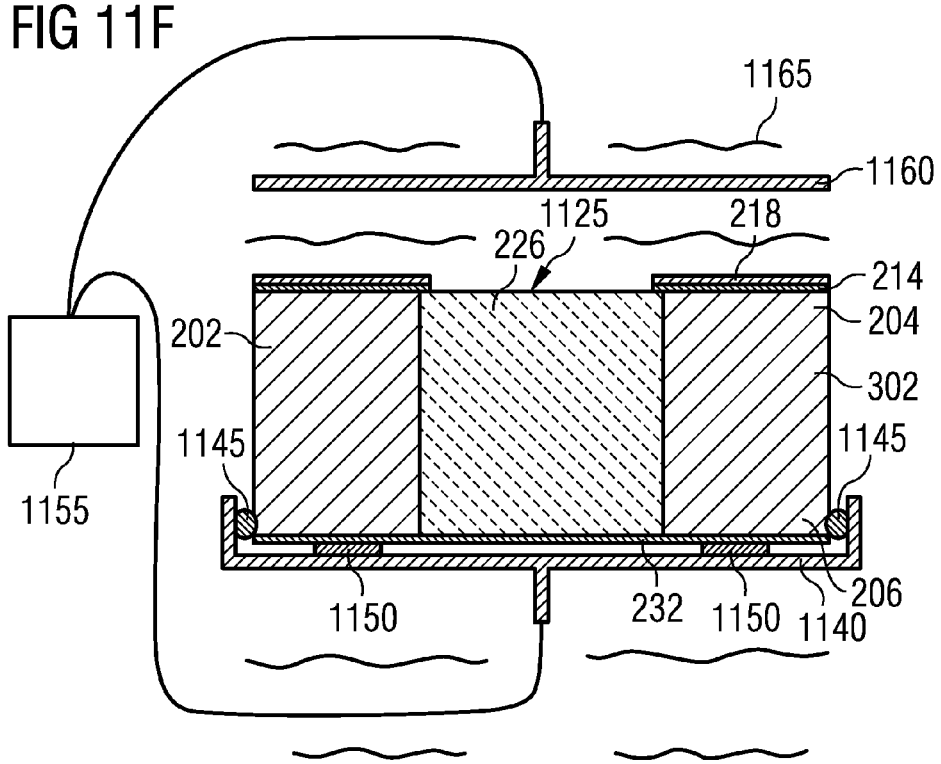

Next, as illustrated in FIGS. 11E and 11F, an anodic structure is formed on the carrier 302, i.e. wafer 302. To form the anodic structure, electrically conductive layer 232 is deposited on the second side 206 of the SiC carrier 302. The conductive layer 232 is used to provide a conductive contact to the current source in the subsequent steps of this process. The conductive contact 232 can be any conductive material or mixture of materials, including, but not limited to, nickel, copper, aluminum, tungsten, titanium, tantalum, molybdenum, gold, silver or graphite. Deposition methods can include physical vapor deposition (PVD), chemical vapor deposition (CVD), electrochemical deposition (ECD), molecular beam epitaxy (MBE) or vacuum evaporation. The thickness of the conductive contact can vary depending on the properties of the underlying carrier. Typical conductive layer 232 thickness ranges run from 0.1-0.5 μm, although the method disclosed herein is not dependent on the metal thickness deposited.

As illustrated in FIG. 11F, following deposition of the conductive layer, the exposed SiC channel 1125 on the first side 204 of the carrier 302 can be exposed to electrochemical anodization. The SiC carrier 302 with the deposited metal layer 232 acts as a working electrode 234. To facilitate connection of the carrier 302 to a voltage source, carrier 302 is attached to a mount 1140. Mount 1140 is preferably formed of a material that is resistant to attack by hydrofluoric acid (HF). In an embodiment, mount 1140 is formed of a fluorinated polymer, such as is sold under the trade name Teflon®. Moreover, mount 1140 preferably includes a sealing mechanism 1145 which prevents liquid penetration to the second side 206 of the carrier 302. Penetration of liquid into the second side 206 of the carrier 302 may allow, for instance, chemical attack and degradation of deposited metal layer 232. The sealing mechanism 1145 may take the form of wax 1145, for instance, or more preferably, a chemical-resistant gasket 1145. In an embodiment, sealing mechanism 1145 may be formed of a fluorinated polymer material. Mount 1140 further includes an electrical contact 1150. The electrical contact 1150 is connected, through leads, to constant-current voltage source 1155. Voltage source 1155 is further connected to a second electrode 236, which is used to form a counter-electrode 236. Counter-electrode 236 may be constructed of any suitable material. In an embodiment, counter electrode 236 is formed of platinum.

Mount 1140 with working electrode 232 and counter electrode 236 are immersed in a solution, represented schematically by wavy lines 1165, including HF and deionized (D.I.) water. The concentration of solution 1165 can vary from 0.5-10%, depending on the etch speed and film porosity desired. In an embodiment, solution 165 is 2% HF.

The carrier 302 is anodized using a beginning voltage of 70V and a current density of 60 mA/cm$^2$ for a period of about 60 minutes, for example. Voltage and current is monitored during the anodization process. The range of time, voltages and current densities will vary depending on the porosity desired in the finished product, and are not limiting with respect to the present die separation technique. In a first embodiment, the anodization process is complete when the porous SiC layer 1170 has been formed throughout the carrier, as shown in FIG. 11F. In another embodiment, the anodization process is stopped before layer 1170 completely penetrates carrier 302. When anodization is performed according to this embodiment, second side 206 of the carrier 302 may be thinned in a subsequent step using a mechanical process, such as polishing, to remove that portion of second side 206 of carrier 302 that was not electrochemically anodized. Once carrier 302 has been thinned according to this subsequent step, layer 1170 will extend substantially through the entire thickness of carrier 302.

Figure 11G:
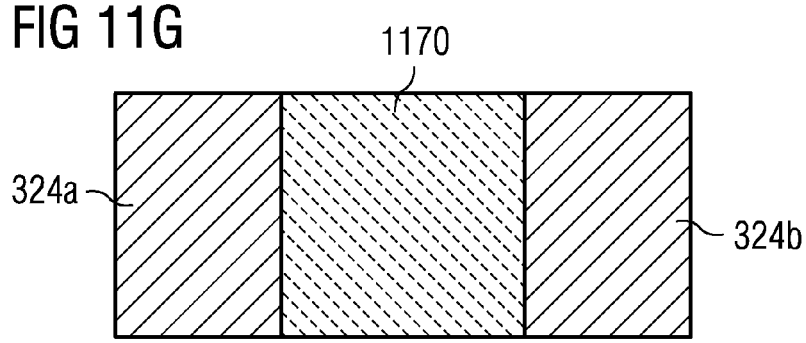

Upon completion of the anodization process, the remaining portion of auxiliary layers 214, 218, and layer 232 are removed from the carrier 302, resulting in the structure illustrated in FIG. 11G. Layer 232 may be removed using, for instance, a plasma ion etch. Second auxiliary layer 218 may also be removed using a dry etch method, such as RIE or plasma etch. First auxiliary layer, 214 may be removed using plasma etch, or alternatively, a wet etch method such as HF/DI water solution or a buffered oxide etch (BOE) containing ammonia (NH$_4$), HF, and DI water, for example. The method disclosed herein is not dependent on the auxiliary layer and working electrode removal processes, and as such, is not limited to these processes. The method used is dependent on a number of factors including, but not limited to, cost.

Figure 11H:
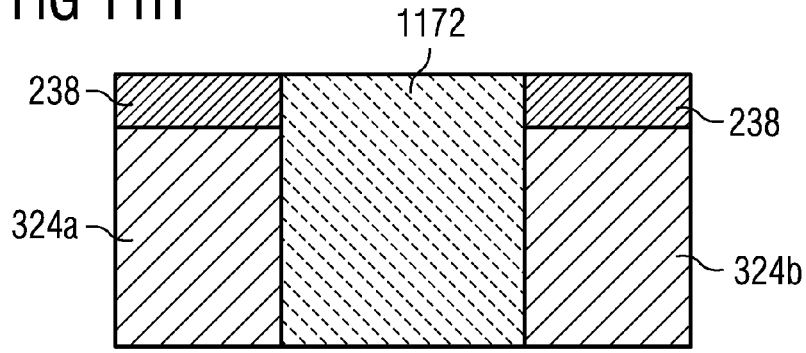

Following removal of auxiliary layers 214, 218 and layer 232, layer 1170 is optionally subjected to a wet thermal oxidation step to form a SiO$_2$ layer 1172 as illustrated in FIG. 11H. The conditions used for the oxidation process will vary depending on the thickness of the device and the degree of porosity achieved in the anodization step. Typical wet thermal oxidation conditions will range from 900-1200 C, for a period between 6-12 hours. Oxidized area 1172 preferentially extends throughout the full depth of the wafer. Again, the oxidation method disclosed herein is equally applicable to other oxidation processes at this stage including, but not limited to, dry oxidation.

After completion of the optional oxidation step, the wafer then proceeds through normal front-end processing. Front-end processing, in this case, refers to deposition of the various metallization, insulation and interconnect layers of the device, including for instance, the various circuits forming the active areas of the device. The front-end process will not be discussed in detail, as the chip separation method disclosed herein is not dependent on the steps performed during front-end processing. As such, the disclosed method is broadly applicable to any type of wafer-based semiconductor device. A wafer that has the completed the front-end process is shown schematically in FIG. 11H. The circuitry and layers including the completed devices are represented by structure 238.

Figure 12:
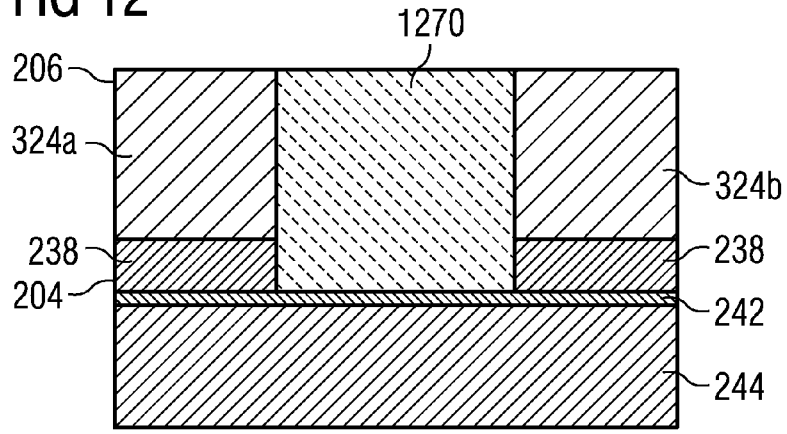
FIG. 12 illustrates an intermediate stage in a method for separating semiconductor die using material modification.

Similarly to the process described with respect to FIG. 2I, at the completion of front end processing the carrier 302 included the completed devices 238 is then optionally transferred to a supporting material 244, e.g. a platform 244 using methods known to one of skill in the art, as illustrated in FIG. 12. Exemplary platform materials include glass, quartz, silicon, or graphite, for example. Platform 244 will typically additionally include a supporting material 242, which may include an adhesive foil. The first side 204 of the carrier 302 is attached to the platform 244 through the use of the adhesive present on foil 242. Platform 244 stabilizes and secures the carrier 302 and devices 238 before, during and after the separation process.

Similarly to the process described with respect to FIG. 2J, one or more portions, e.g. regions 1270, which may include layer 1170 or oxidized area 1172, may be selectively removed by etching, e.g. plasma etching, e.g. chemical etching, e.g. chemical etching with buffered hydrofluoric acid.

Figure 13:
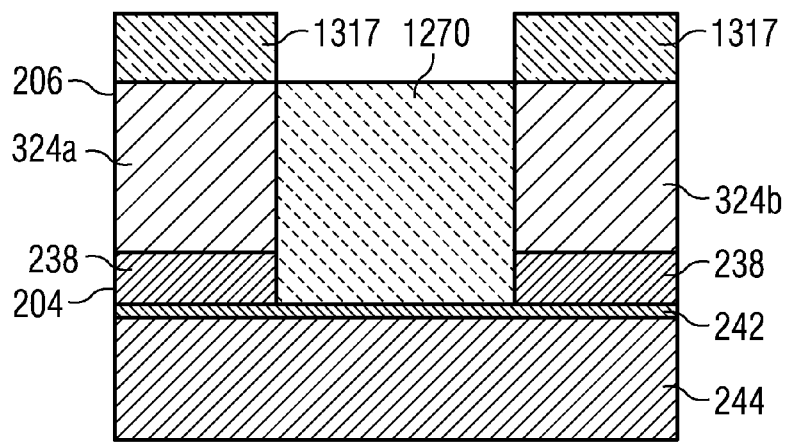
FIG. 13 illustrates an intermediate stage in a method for separating semiconductor die using material modification.

As illustrated in FIG. 13, after attaching carrier 302 to platform 244, a resist layer 1317 is applied to second side 206. The resist 1317 application process is similar to the processes described earlier, and will not be further discussed, as the current method is not dependent on the resist application process. Following deposition and curing, resist 1317 is patterned using known methods to uncover region 1270, as is also illustrated in FIG. 13.

Following removal of resist 1317, porous silicon-containing material from porous silicon-containing region 1270 is removed. Region 1270 may include the properties of region 1170 or oxidized region 1172. The removal process may vary depending on whether region 1270 has been subjected to the optional oxidation step. In one embodiment, dry etching means are used. In this embodiment, the term dry etching means refers to techniques such as plasma etch or reactive ion etch, or any other means used in the art to selectively etch semiconductor or metal surfaces. In a second embodiment, a wet chemical etch is used to remove region 1270. This may be particularly advantageous when region 1270 has been subjected to the optional oxidation step, for instance. In this embodiment, an exemplary wet chemical etchant is hydrofluoric acid. The die separation process disclosed herein is not dependent on the use of a particular chemical or dry etchant however, and the particular etching process used will vary depending on a number of factors including, for instance, cost. Once the etching process is complete, the photoresist layer 1317 is removed using known processes, resulting in the structure illustrated in FIG. 14, and the separated die 324 continue on to the remaining steps in the production process such as packaging, for example.

Whereas FIGS. 2J, and FIGS. 12 to 14 demonstrate how one or more portions of carrier 302 may be removed by chemical means, in order to separate the dies, FIGS. 6 to 10 show how the dies 324 may be separated by mechanical means.

Figure 14:
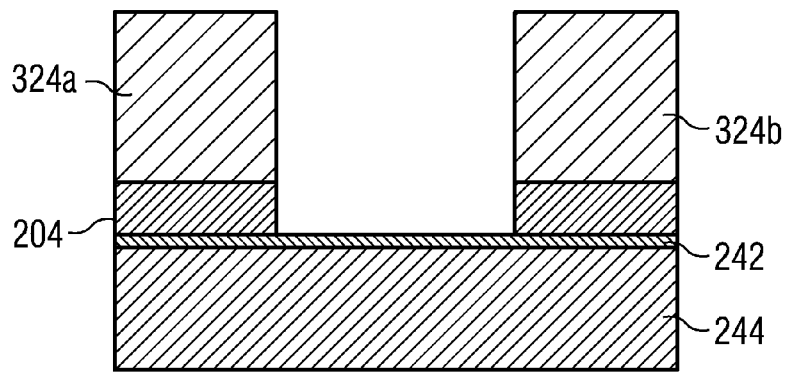
FIG. 14 illustrates an intermediate stage in a method for separating semiconductor die using material modification.
Figure 15:
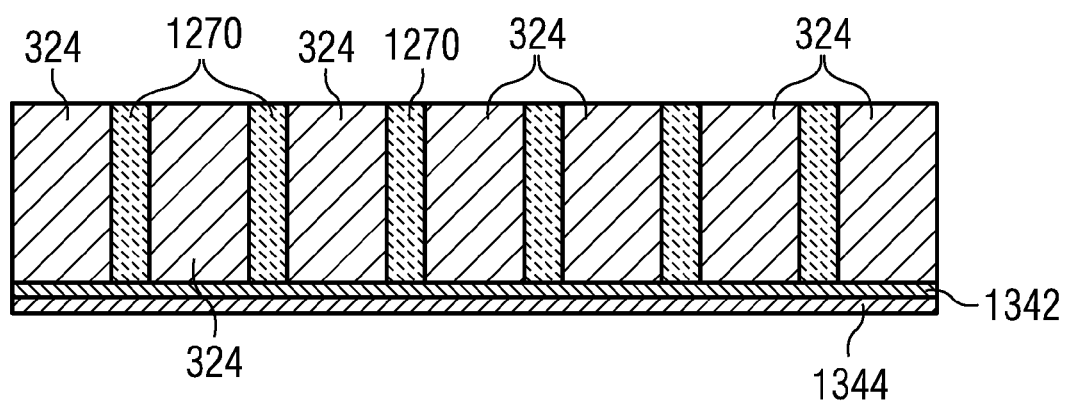
FIG. 15 illustrates an embodiment in the method for separating semiconductor die using material modification.

In another embodiment, if optional platform 244 shown in FIGS. 12-14 is not used, the completed carrier 302 including the porous SiC regions 1270, which may have been subjected to the optional oxidation step, may be attached directly to flexible foil 1344 as shown in FIG. 15. Foil 1344 includes adhesive 1342 similar to that used on foil 242 attached to the supporting material 244 in FIGS. 12-14. In the embodiment illustrated in FIG. 15, once carrier 302 including completed devices has been attached to foil 1344, the completed devices are ready for separation according to several embodiments. Separation can occur through a number of different mechanical methods, described below.

In a first embodiment FIG. 6, carrier 302 including completed die is separated by mechanical means such as, for instance, mechanical rollers 620, 621. Rollers 620, 621 may be constructed of any number of suitable materials, including for example metal, plastic, Teflon, or a combination thereof. In the current example, there is a set of three rollers at the point of separation, two 620 located on top of the carrier 302, and one 621 located below the carrier 302 and supporting material, e.g. flexible foil 1344 and adhesive 1342. As is shown in FIG. 6, the completed wafer containing the individual die, carrier 302 is moved through the rollers 620, 621 by conveyer assembly. When the completed wafers reach the rollers 620, 621 they are subjected to a mechanical stress due to the differing numbers of rollers on top 620 and bottom 621 of the roller mechanism, as well as the positioning of the rollers relative to each other. This causes a stress on the carrier 302 as it passes through the rollers 620, 621. As a result of the stress, carrier 302 preferentially separates at the porous SiC region 1270 between each of the die 324. In this embodiment, the carrier 302 may remain connected together in the porous SiC region (not shown) oriented in the direction parallel to the direction of movement of the flexible foil.

Figure 7A:
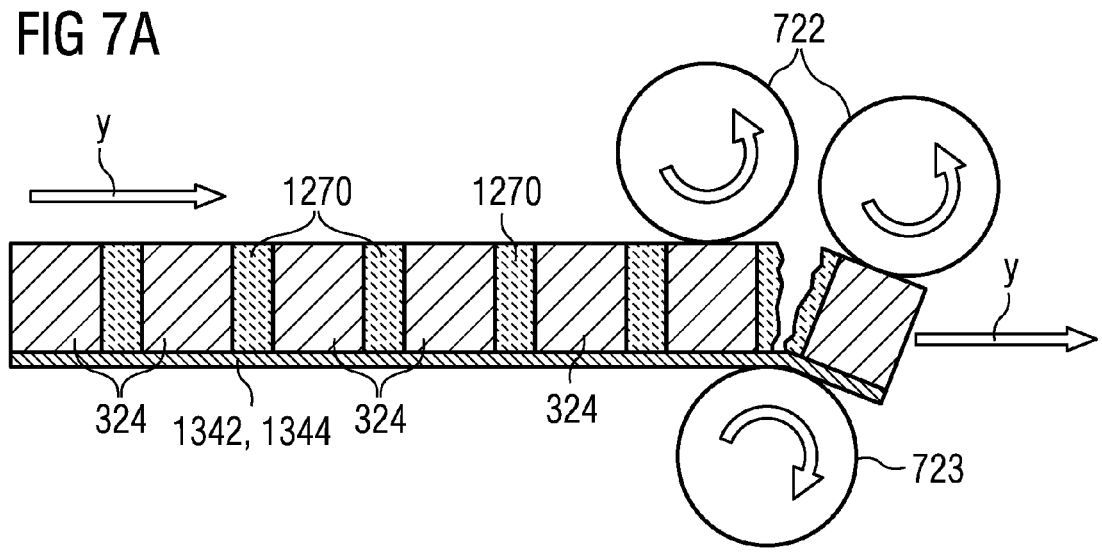
FIGS. 7A and 7B illustrate stages in an embodiment in the method for separating semiconductor die using material modification.
Figure 7B:
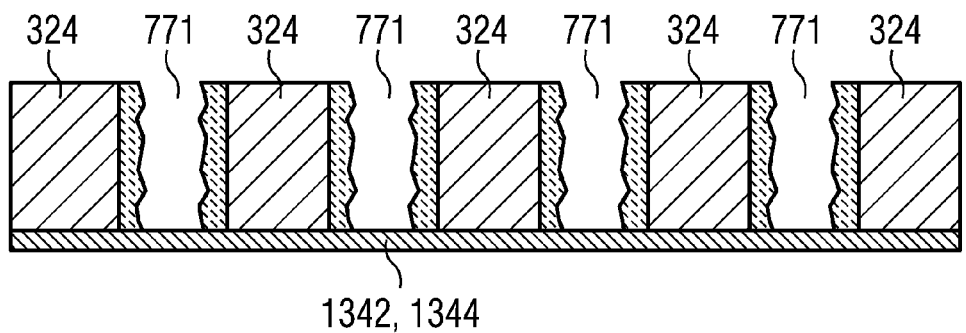

Subsequently, if the die 324 do not separate in both the x- and y-directions in the first step of mechanical separation according to this embodiment, a second set of rollers 722, 723, oriented in a similar manner to the first set of rollers 620, 621, but perpendicular to the first set, stresses the carrier 302 as illustrated in FIG. 7A. Stressing in this direction fractures carrier 302 in the direction parallel to the original direction motion of the supporting material, e.g. at least one of flexible foil 1344 and adhesive 1342. This completes the separation process in each of the x and y directions, as illustrated by the separated areas 771 shown in FIG. 7B. At this point, the completely separated die 324 may be removed from the supporting material 1344 using techniques known in art, and the die can be sent on for packaging and other back-end processing.

Figure 8:
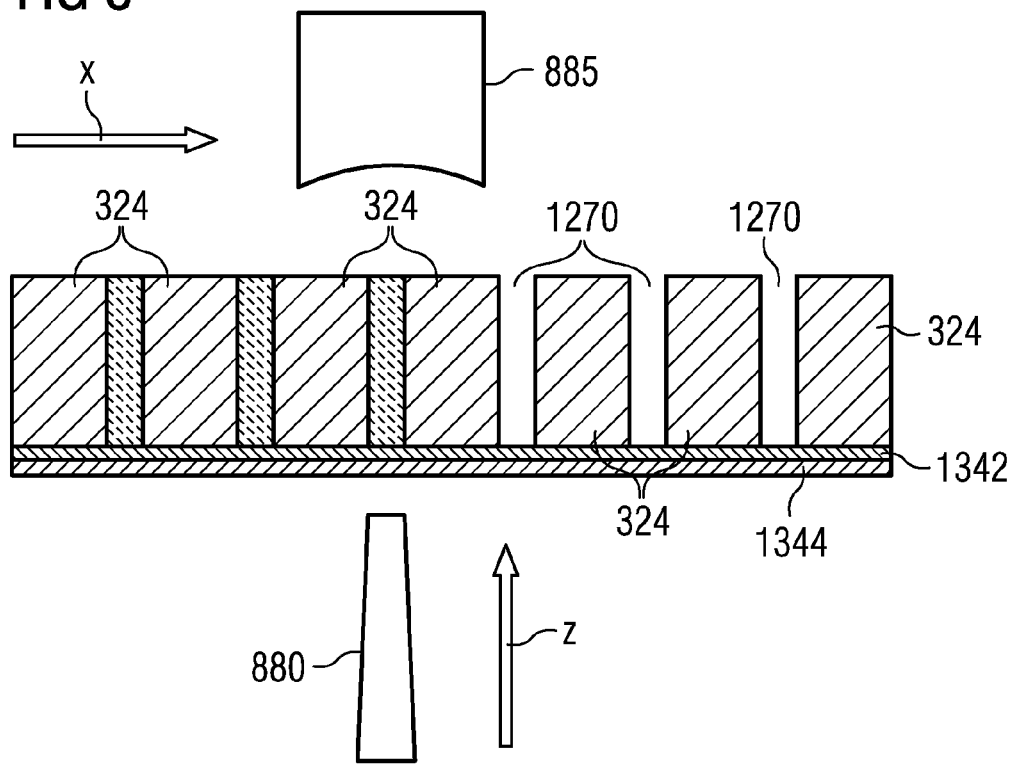
FIG. 8 illustrates an embodiment in the method for separating semiconductor die using material modification.

FIG. 8 illustrates another embodiment. In this embodiment, the die are separated using an alternative mechanical means. In this embodiment, carrier 302 containing completed die is mounted onto flexible foil supporting material, e.g. at least one of foil 1342 and platform 1344 as before. The supporting material moves wafer carrier 302 in the x-direction, as shown in FIG. 8. Under the supporting material 1342, 1344 is located one or more substantially rigid punches 880. At predetermined intervals, the motion of supporting material 1342, 1344 in the x-direction is stopped. When the supporting material 1342,1344 stops, punch 880 is urged upwards. The top portion of punch 880 is allowed to contact supporting material 1342,1344, and to urge supporting material 1342, 1344 upwards. This causes the portion of supporting material 1342,1344, that is contacted by punch 880, i.e. at least one of foil 1342 and platform 1344, to arc upwards, toward a wafer barrier 885. When carrier 302 contacts wafer bather 885, the upward motion of punch 880 is substantially stopped. At this point, the die have fractured at the oxygen-embrittled regions 1270 along both the x and y directions. After a brief compression period, punch 880 is withdrawn, and supporting material 1342,1344 moves along in the x-direction, bringing a new carrier 302 into position for separation. The previously processed wafer with all die separated in the x- and y-directions continues through the back end process.

Figure 9:
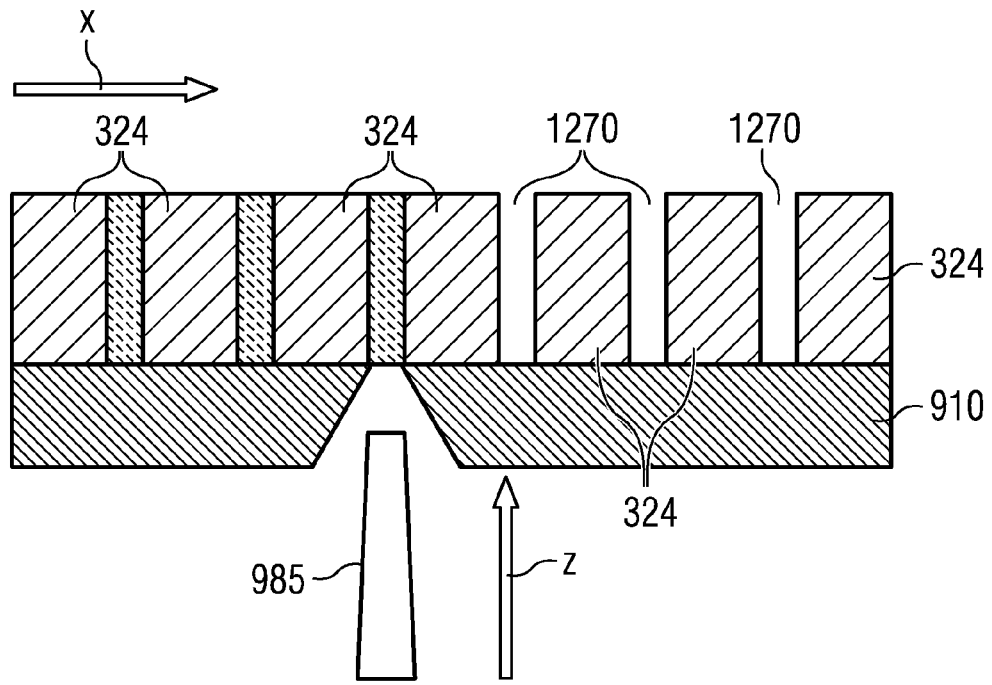
FIG. 9 illustrates an embodiment in the method for separating semiconductor die using material modification.

FIG. 9 illustrates another embodiment. In this embodiment, the die are held in place using a vacuum means 910. In this embodiment, carrier 302 including completed die is mounted onto a vacuum chuck 910. Under vacuum chuck 910 is located one or more substantially rigid punches 985. A conveyer mechanism containing the vacuum chuck 910 moves carriers 302 through the process in the x-direction, as shown in FIG. 9. At predetermined intervals, vacuum chuck 910 is moved in the x-direction and then stopped. When vacuum chuck 910 stops, punch 985 is urged upwards. The top portion of punch 985 is allowed to pass through an opening in vacuum chuck 910 and to urge the exposed area of carrier 302, causing carrier 302 to arc upwards. There is no need for a, e.g., wafer barrier 858 as shown in FIG. 8 in this embodiment, as carrier 302 is held tightly by a vacuum force against vacuum chuck 910. Thus, stress is applied at the local area of fracture only. At this point of pressure between punch 985 and wafer carrier 302, the dies fracture at the porous SiC region 1270 along both the x and y directions. After a brief impact, punch 985 is withdrawn, and the conveyer mechanism including vacuum chuck 910 moves along in the x-direction, bringing a new completed carrier 302 into position for separation. The processed wafer with all die separated continues through the back end process.

Figure 10A:
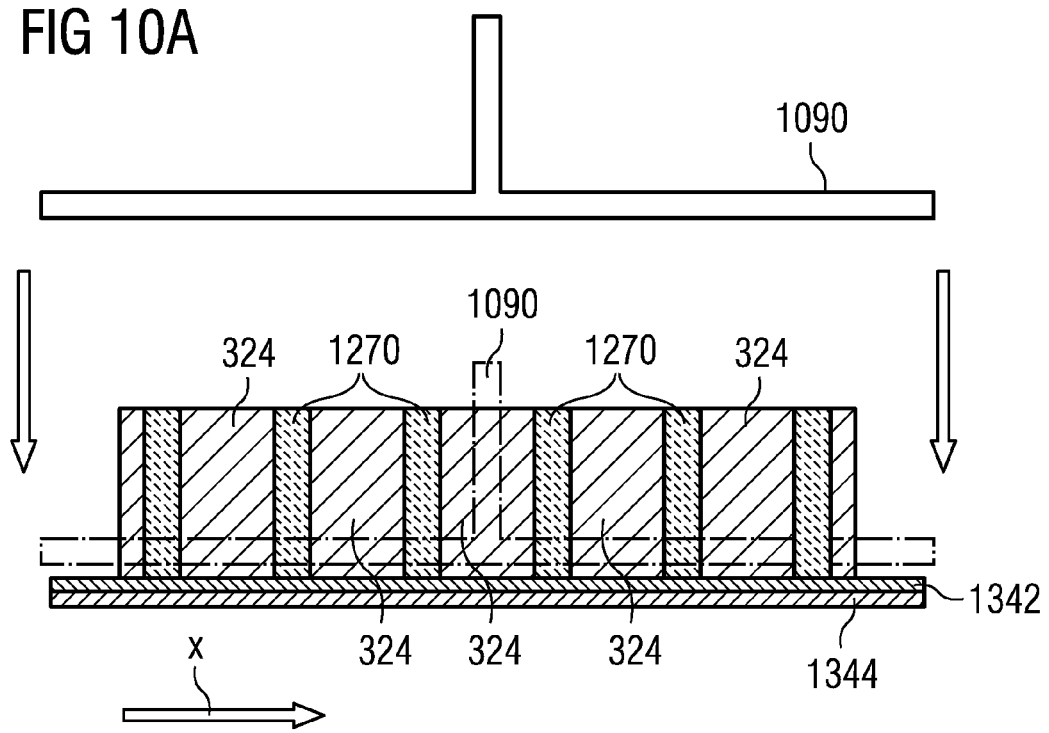
FIGS. 10A and 10B illustrate stages in an embodiment in the method for separating semiconductor die using material modification.
Figure 10B:
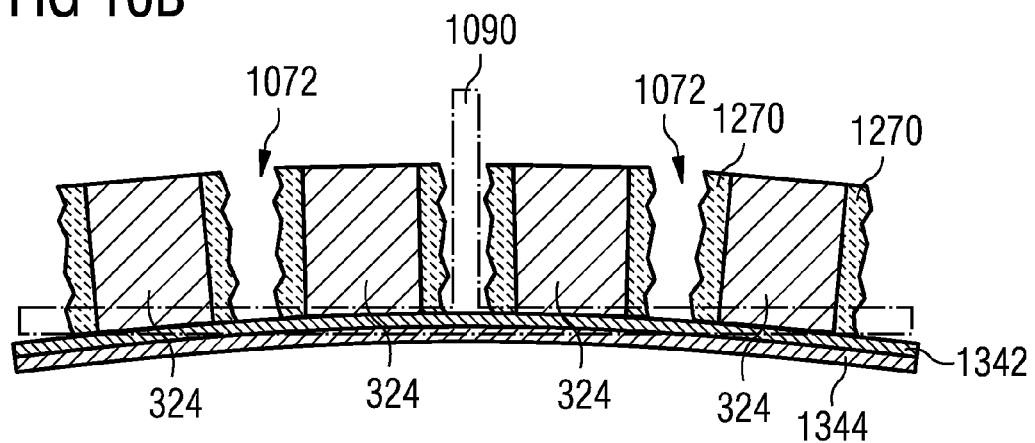

In another embodiment, the mechanical means used to separate the die does not contact carrier 302. In this embodiment, carrier 302 is attached to flexible foil 1344 using adhesive 1342, as shown in FIG. 10A. The mechanical separation means in this embodiment takes the form of a rigid ring 1090 that is slightly larger in circumference than carrier 302. As with previous embodiments, flexible foil 1344 including carrier 302 is moved in the x-direction. When carrier 302 is in position, motion stops. Ring 1090 is lowered around carrier 302 and pressed against flexible foil 1344, as illustrated in FIG. 10A. Flexible foil 1344 is deformed, as schematically illustrated in FIG. 10B. Because carrier 302 is adhesively bound 1342 to flexible foil 1344, compression of flexible foil 1344 causes stress in the areas of the die where there is porous SiC 1270, and the die fractures in those areas.

In an alternative embodiment, carrier 302 is not moved, but instead, rigid ring 1090 is mounted on a robotic arm (not shown). In this case, the robotic arm is able to move to the various stationary carriers 302, where it applies pressure around carrier 302 in the manner illustrated in FIG. 10B.

A person skilled in the art will recognize that combinations of the above exemplary embodiments may be formed. For example, full or partial etching as discussed in FIGS. 13 and 14 may be combined with the mechanical impact techniques as illustrated in FIGS. 6 through 10 and 15. A wafer bather 885, such as shown in FIG. 8 may be used in conjunction with the vacuum means 910 and punch 985 as illustrated in FIG. 9. Conversely, the flexible foil supporting material 1344 and substantially rigid punch 880 discussed in FIG. 8 may be used without a wafer bather 885. Moreover, a vacuum means 910 as disclosed in FIG. 9 may be employed with the rigid ring 1090 illustrated in FIG. 10.

A method for separating semiconductor die is provided according to various embodiments. The method includes: forming a porous region on a semiconductor wafer; and separating the die at the porous region.

According to an embodiment, the semiconductor die include silicon carbide.

According to an embodiment, the porous area is formed using anodic means.

According to an embodiment, the anodic means further includes hydrofluoric acid.

According to an embodiment, the separating is done using mechanical means.

According to an embodiment, the separating is done chemically.

A method for separating semiconductor die is provided according to various embodiments. The method includes: forming a porous region on a semiconductor wafer; oxidizing the porous area to form an oxidized region; and separating the die at the oxidized region.

According to an embodiment, the oxidizing is done using a wet thermal process.

According to an embodiment, the porous area is formed using hydrofluoric acid.

According to an embodiment, the separating is done using mechanical means.

According to an embodiment, the mechanical means includes a substantially rigid ring.

According to an embodiment, the separating is done using chemical means.

A method for separating semiconductor die is provided according to various embodiments. The method includes: forming a porous area on a semiconductor wafer; oxidizing the porous area to form an oxidized area; attaching the semiconductor wafer to a supporting material; and separating the die at the oxidized area.

According to an embodiment, the method further includes removing the supporting material after separation.

A method for separating semiconductor die is provided according to various embodiments. The method includes: depositing a first auxiliary layer on a first side of a semiconductor wafer; depositing a second auxiliary layer on the first auxiliary layer; etching the second auxiliary layer; depositing a conductive layer on a second side of a semiconductor wafer; forming a porous area on a semiconductor wafer; oxidizing the porous area to form an oxidized area; attaching the semiconductor wafer to a supporting material; and separating the die at the oxidized area.

According to an embodiment, the method of separation includes dry etchant.

According to an embodiment, the method of separation includes mechanical force.

According to an embodiment, the method of separation includes chemical means. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for separating semiconductor die, comprising:
   forming a sacrificial region on a semiconductor wafer; and
   separating the die at the sacrificial region, wherein separating the die comprises
      providing a punch beneath the semiconductor wafer,
      providing a barrier above the semiconductor wafer, the barrier including a concave surface facing the semiconductor wafer and an apex of the concave surface aligned with the punch;
      moving the semiconductor wafer to a first position relative to the punch,
      urging the punch towards the semiconductor wafer to fracture the sacrificial region at the first position,
      moving of the semiconductor wafer to a second position relative to the punch, and
      urging the punch towards the semiconductor wafer to fracture the sacrificial region at the second position
      wherein the urging of the punch causes the semiconductor wafer to arc upwards and contact the concave surface of the barrier and wherein the urging of the punch stops when the semiconductor wafer contacts the barrier.

2. The method of separating semiconductor die of claim 1, further comprising:
   holding the semiconductor wafer on a vacuum chuck, the vacuum chuck comprises an opening for the punch; and
   wherein when urging towards the semiconductor wafer, the punch passes through the opening to cause the semiconductor wafer to arc upwards and fracture the sacrificial region.

3. The method of separating semiconductor die of claim 1, further comprising attaching the semiconductor wafer to a flexible supporting material.

4. The method of separating semiconductor die of claim 1, wherein the sacrificial region comprises a porous region.

5. The method of separating semiconductor die of claim 4, further comprising oxidizing the porous region to form an oxidized region.

6. A method for separating semiconductor die, comprising:
   forming a sacrificial area on a semiconductor wafer;
   attaching the semiconductor wafer to a flexible supporting material; and
   separating the die at the sacrificial area, wherein separating the die comprises
      providing a ring, and
      arcing the semiconductor wafer and fracturing the semiconductor wafer at the sacrificial area by pressing the ring against the flexible supporting material.

7. The method of separating semiconductor die of claim 6, wherein pressing the ring against the flexible supporting material causes stress at the sacrificial area around the die.

8. A method for separating semiconductor die, comprising:
depositing a first auxiliary layer on a first side of a semiconductor wafer;
depositing a second auxiliary layer on the first auxiliary layer;
etching the first and second auxiliary layers;
depositing a conductive layer on a second side of the semiconductor wafer;
forming a sacrificial area on the semiconductor wafer using the first and second auxiliary layers as a mask; and
separating the die at the sacrificial area, wherein separating the die comprises
providing a punch beneath the semiconductor wafer,
providing a barrier above the semiconductor wafer, the barrier including concave surface facing the semiconductor wafer and an apex of the concave surface aligned with the punch;
moving the semiconductor wafer to a first position relative to the punch,
urging the punch towards the semiconductor wafer to fracture the sacrificial area at the first position,
moving the semiconductor wafer to a second position relative to the punch, and
urging the punch towards the semiconductor wafer to fracture the sacrificial area at the second position,
wherein the urging of the punch causes the semiconductor wafer to arc upwards and contact the concave surface of the barrier and wherein the urging of the punch stops when the semiconductor wafer contacts the barrier.

9. The method of separating semiconductor die of claim 8, further comprising:
holding the semiconductor wafer on a vacuum chuck, the vacuum chuck comprises an opening for the punch; and
wherein when urging towards the semiconductor wafer, the punch passes through the opening to fracture the sacrificial area.

10. The method of separating semiconductor die of claim 8, further comprising attaching the semiconductor wafer to a flexible supporting material.

11. The method of separating semiconductor die of claim 8, wherein the sacrificial area comprises a porous area.

12. The method of separating semiconductor die of claim 11, further comprising oxidizing the porous area to form an oxidized area.

13. A method for separating semiconductor die, comprising:
forming a sacrificial region on a semiconductor wafer; and
separating the die at the sacrificial region, wherein separating the die comprises
providing a device beneath the semiconductor wafer,
holding the semiconductor wafer on a vacuum chuck, the vacuum chuck comprises an opening for the device,
moving the semiconductor wafer to a first position relative to the device,
urging the device towards the semiconductor wafer to fracture the sacrificial region at the first position,
moving of the semiconductor wafer to a second position relative to the device,
urging the device towards the semiconductor wafer to fracture the sacrificial region at the second position, and
wherein when urging towards the semiconductor wafer, the device passes through the opening to cause the semiconductor wafer to arc upwards and fracture the sacrificial region.

14. The method of claim 13, wherein the device is a punch.

15. A method for separating semiconductor die, comprising:
depositing a first auxiliary layer on a first side of a semiconductor wafer;
depositing a second auxiliary layer on the first auxiliary layer;
etching the first and second auxiliary layers;
depositing a conductive layer on a second side of the semiconductor wafer;
forming a sacrificial area on the semiconductor wafer using the first and second auxiliary layers as a mask; and
separating the die at the sacrificial area, wherein separating the die comprises
providing a punch beneath the semiconductor wafer,
holding the semiconductor wafer on a vacuum chuck, the vacuum chuck comprises an opening for the punch,
moving the semiconductor wafer to a first position relative to the punch,
urging the punch towards the semiconductor wafer to fracture the sacrificial area at the first position,
moving the semiconductor wafer to a second position relative to the punch, and
urging the punch towards the semiconductor wafer to fracture the sacrificial area at the second position,
wherein when urging towards the semiconductor wafer, the punch passes through the opening to cause the semiconductor wafer to arc upwards and fracture the sacrificial region.

* * * * *